(12) United States Patent
Huang

(10) Patent No.: US 12,514,000 B2
(45) Date of Patent: Dec. 30, 2025

(54) SEMICONDUCTOR DEVICE STRUCTURE WITH FUSE AND RESISTOR AND METHOD FOR PREPARING THE SAME

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 371 days.

(21) Appl. No.: 18/239,859

(22) Filed: Aug. 30, 2023

(65) Prior Publication Data

US 2024/0371857 A1    Nov. 7, 2024

Related U.S. Application Data

(62) Division of application No. 18/143,706, filed on May 5, 2023, now Pat. No. 12,408,444.

(51) Int. Cl.
| | |
|---|---|
| *H10D 89/60* | (2025.01) |
| *H01L 23/522* | (2006.01) |
| *H01L 23/525* | (2006.01) |
| *H01L 23/528* | (2006.01) |
| *H01L 23/64* | (2006.01) |

(52) U.S. Cl.
CPC ....... *H10D 89/911* (2025.01); *H01L 23/5226* (2013.01); *H01L 23/5256* (2013.01); *H01L 23/528* (2013.01); *H01L 23/647* (2013.01)

(58) Field of Classification Search
CPC .............. H10D 89/911; H01L 23/5226; H01L 23/5256; H01L 23/528; H01L 23/647

USPC .......................................................... 257/529
See application file for complete search history.

(56) References Cited

U.S. PATENT DOCUMENTS

| | | | |
|---|---|---|---|
| 8,003,461 B1 * | 8/2011 | Hsu ...................... | H10D 84/038 |
| | | | 257/E21.396 |
| 2011/0303982 A1 | 12/2011 | Chung et al. | |
| 2012/0112311 A1 | 5/2012 | Cho et al. | |
| 2012/0196423 A1 | 8/2012 | Kanike et al. | |
| 2014/0183657 A1 | 7/2014 | Lim et al. | |
| 2017/0170116 A1 | 6/2017 | He et al. | |
| 2019/0067191 A1 | 2/2019 | Wong et al. | |

OTHER PUBLICATIONS

Office Action and and the search report mailed on Mar. 26, 2024 related to Taiwanese Application No. 112125795.
Office Action and and the search report mailed on Jul. 29, 2024 related to Taiwanese Application No. 113108411.

* cited by examiner

*Primary Examiner* — Tu-Tu V Ho
(74) *Attorney, Agent, or Firm* — Xuan Zhang

(57) ABSTRACT

A semiconductor device structure includes an isolation structure disposed in a semiconductor substrate. The semiconductor device structure also includes a fuse and a resistor electrode disposed in the semiconductor substrate. The isolation structure is disposed between the fuse and the resistor electrode, and the isolation structure is closer to the resistor electrode than the fuse. The semiconductor device structure further includes a source/drain (S/D) region disposed in the semiconductor substrate and between the fuse and the isolation structure. The S/D region is electrically connected to the resistor electrode.

13 Claims, 29 Drawing Sheets

SEMICONDUCTOR DEVICE STRUCTURE WITH FUSE AND RESISTOR AND METHOD FOR PREPARING THE SAME

CROSS-REFERENCE TO RELATED APPLICATION

This application is a divisional application of U.S. Non-Provisional application Ser. No. 18/143,706 filed May 5, 2023, which is incorporated herein by reference in its entirety.

TECHNICAL FIELD

The present disclosure relates to a semiconductor device structure and a method for preparing the same, and more particularly, to a semiconductor device structure with a fuse and a resistor and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause problems. For example, a shrinking resistor formed by a conventional process flow may have an insufficient sheet resistance. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes an isolation structure disposed in a semiconductor substrate. The semiconductor device structure also includes a fuse and a resistor electrode disposed in the semiconductor substrate. The isolation structure is disposed between the fuse and the resistor electrode, and the isolation structure is closer to the resistor electrode than the fuse. The semiconductor device structure further includes a source/drain (S/D) region disposed in the semiconductor substrate and between the fuse and the isolation structure. The S/D region is electrically connected to the resistor electrode.

In an embodiment, an air gap is enclosed in the fuse. In an embodiment, the fuse is an electrical fuse. In an embodiment, a top width of the resistor electrode is greater than a top width of the fuse. In an embodiment, the fuse and the resistor electrode comprise polysilicon. In an embodiment, a dopant concentration of the fuse is greater than a dopant concentration of the resistor electrode. In an embodiment, a top surface of the fuse is substantially coplanar with a top surface of the resistor electrode.

In an embodiment, the semiconductor device structure further includes a well region disposed in the semiconductor substrate, wherein the resistor electrode is disposed over the well region. In an embodiment, the well region adjoins the isolation structure. In an embodiment, the semiconductor device structure further includes a dielectric layer disposed over the semiconductor substrate, wherein a first portion of the dielectric layer extends between the fuse and the semiconductor substrate. In an embodiment, a second portion of the dielectric layer extends between the resistor electrode and the semiconductor substrate. In an embodiment, the isolation structure is covered by the dielectric layer.

In an embodiment, the semiconductor device structure further includes an interlayer-dielectric (ILD) layer disposed over the semiconductor substrate, wherein the fuse and the resistor electrode are covered by the ILD layer. In an embodiment, the semiconductor device structure further includes an interconnect structure disposed in the ILD layer, wherein the S/D region is electrically connected to the resistor electrode through the interconnect structure.

In an embodiment, the interconnect structure includes a first conductive via and a second conductive via disposed in the ILD layer, wherein the first conductive via is electrically connected to the S/D region, and the second conductive via is electrically connected to the resistor electrode. In addition, the interconnect structure also includes a conductive layer disposed over the ILD layer and electrically connecting the first conductive via and the second conductive via. In an embodiment, the semiconductor device structure further includes a conductive structure disposed in the semiconductor structure and over the isolation structure, wherein the S/D region is electrically connected to the resistor electrode through the conductive structure.

In another embodiment of the present disclosure, a semiconductor device structure is provided. The semiconductor device structure includes a fuse and a resistor electrode disposed in a semiconductor substrate. A dopant concentration of the fuse is greater than a dopant concentration of the resistor electrode. The semiconductor device structure also includes an isolation structure disposed in the semiconductor substrate and between the fuse and the resistor electrode. The semiconductor device structure further includes a source/drain (S/D) region disposed in the semiconductor substrate and between the fuse and the isolation structure. The S/D region is electrically connected to the resistor electrode.

In an embodiment, an air gap is enclosed in the fuse. In an embodiment, the fuse is an electrical fuse. In an embodiment, a top width of the resistor electrode is greater than a top width of the fuse. In an embodiment, the isolation structure is closer to the resistor electrode than the fuse. In an embodiment, the fuse and the resistor electrode comprise polysilicon.

In an embodiment, the semiconductor device structure further includes a well region disposed in the semiconductor substrate, wherein the resistor electrode is disposed over the well region, and a conductivity type of the well region is the same as a conductivity type of the S/D region. In an embodiment, the semiconductor device structure further includes a dielectric layer disposed over the semiconductor substrate, wherein the fuse is separated from the semiconductor substrate by a first portion of the dielectric layer, and the resistor electrode is separated from the well region by a second portion of the dielectric layer.

In an embodiment, a top surface and a sidewall of the isolation structure are in direct contact with the dielectric layer. In an embodiment, the semiconductor device structure further includes a conductive structure disposed in the semiconductor substrate and over the isolation structure, wherein the conductive structure is in direct contact with the S/D region and the resistor electrode. In an embodiment, a top surface of the fuse, a top surface of the resistor electrode, and a top surface of the conductive structure are substantially coplanar with each other.

In yet another embodiment of the present disclosure, a method for preparing a semiconductor device structure is provided. The method includes forming an isolation structure in a semiconductor substrate, and recessing the semiconductor substrate to form a first opening and a second opening. The first opening and the second opening are on opposite sides of the isolation structure, and a width of the second opening is greater than a width of the first opening. The method also includes forming an electrode layer over the semiconductor substrate, and polishing the electrode layer to form a fuse in the first opening and a resistor electrode in the second opening. The method further includes forming a source/drain (S/D) region in the semiconductor substrate. The S/D region is between the fuse and the isolation structure.

In an embodiment, an air gap is enclosed in the fuse. In an embodiment, the method further includes forming a well region in the semiconductor substrate before the first opening and the second opening are formed, wherein the second opening is formed by removing an upper portion of the well region. In an embodiment, a bottom surface of the well region is higher than a bottom surface of the isolation structure. In an embodiment, the isolation structure is closer to the second opening than the first opening. In an embodiment, a sidewall of the isolation structure is exposed by the second opening before the electrode layer is formed. In an embodiment, the method further includes depositing a dielectric layer over the semiconductor substrate before the electrode layer is formed, wherein the dielectric layer extends into the first opening and the second opening. In an embodiment, the dielectric layer is in direct contact with a sidewall of the isolation structure. In an embodiment, the method further includes performing an ion implantation process on the electrode layer before the electrode layer is polished.

In an embodiment, a top surface of the fuse is substantially coplanar with a top surface of the resistor electrode after the electrode layer is polished. In an embodiment, the method further includes forming an interlayer-dielectric (ILD) layer over the semiconductor substrate, and forming an interconnect structure in the ILD layer, wherein the S/D region is electrically connected to the resistor electrode through the interconnect structure. In an embodiment, the forming the interconnect structure includes etching the ILD layer to form a third opening exposing the S/D region and a fourth opening exposing the resistor electrode, forming a first conductive via in the third opening and a second conductive via in the fourth opening, and forming a conductive layer over the ILD layer and electrically connecting the first conductive via and the second conductive via. In an embodiment, the method further includes etching an upper portion of the isolation structure to form a fifth opening after the electrode layer is polished, and forming a conductive structure in the fifth opening before the S/D region is formed, wherein the conductive structure is used to electrically connect the resistor electrode and the S/D region.

Embodiments of a semiconductor device structure are provided in the disclosure. The semiconductor device structure includes a transistor and a resistor connected in series and formed by an integrated process flow. In particular, a gate electrode of the transistor and a resistor electrode of the resistor are formed in a semiconductor substrate by the same process steps. Therefore, the resistor may have high sheet resistance without using additional masks or process steps. As a result, the associated costs may be reduced, and the performance of the semiconductor device structure may be improved.

Moreover, the semiconductor device structure includes a fuse and a resistor connected in series and formed by an integrated process flow. Since the fuse and a resistor electrode of the resistor are formed in a semiconductor substrate by the same process steps, the associated costs may be reduced, and the performance of the semiconductor device structure may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
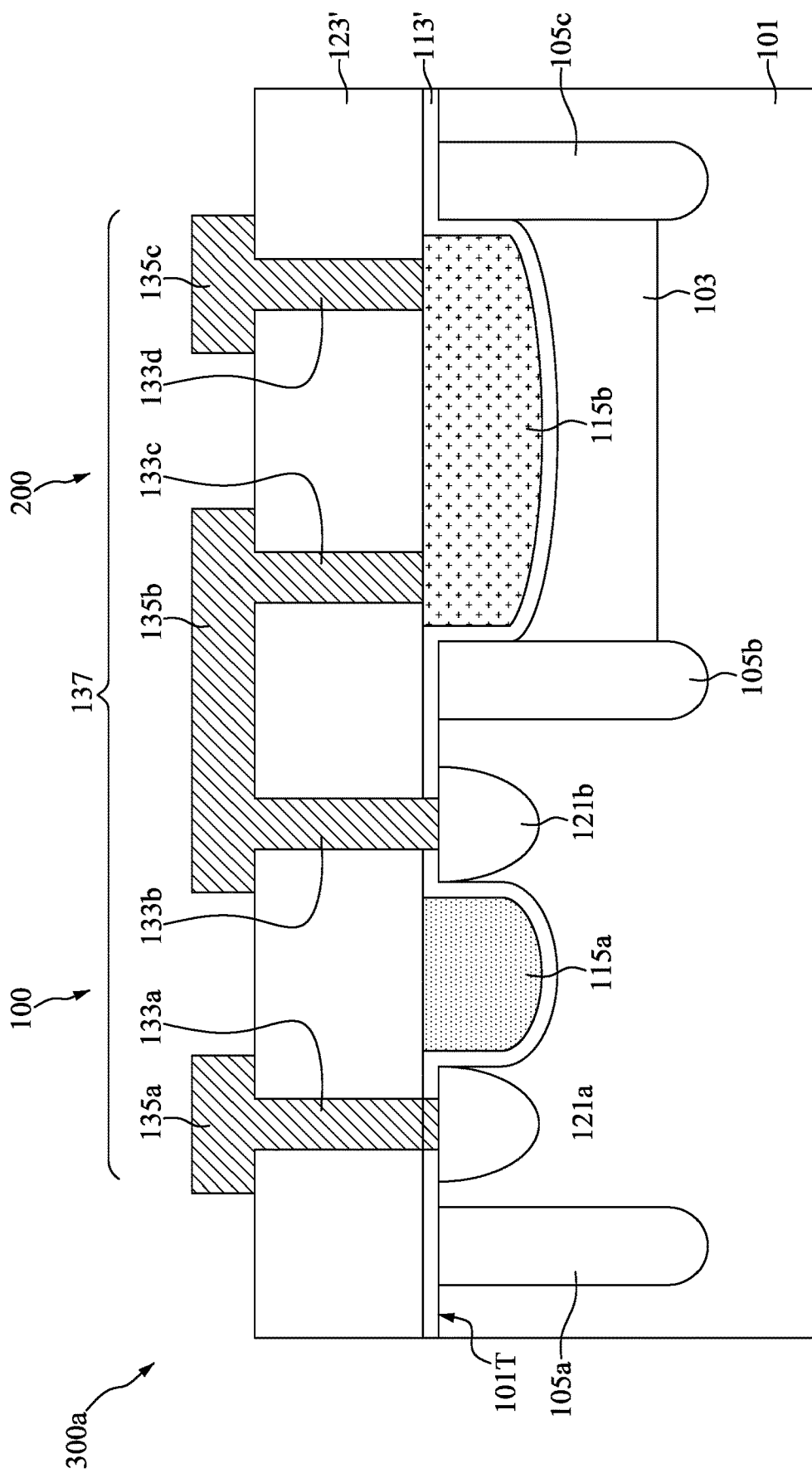
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 300a, in accordance with some embodiments. As shown in FIG. 1, the semiconductor device structure 300a includes a transistor 100 and a resistor 200. In the semiconductor device structure 300a, a plurality of isolation structures 105a, 105b and 105c are disposed in a semiconductor substrate 101, the active region of the transistor 100 is defined by the isolation structures 105a and 105b, and the active region of the resistor 200 is defined by the isolation structures 105b and 105c, in accordance with some embodiments. It should be noted that the number of isolation structures per semiconductor device structure is not limited to three, and may be less or more.

In some embodiments, the semiconductor device structure 300a also includes a gate electrode 115a and source/drain (S/D) regions 121a, 121b in the active region of the transistor 100 (i.e., between the isolation structures 105a and 105b). The gate electrode 115a is located between the S/D regions 121a and 121b, and the gate electrode 115a and the S/D regions 121a, 121b are disposed in the semiconductor substrate 101.

In some embodiments, the semiconductor device structure 300a further includes a well region 103 and a resistor electrode 115b in the active region of the resistor 200 (i.e., between the isolation structures 105b and 105c). The well region 103 and the resistor electrode 115b are disposed in the semiconductor substrate 101, and the resistor electrode 115b is disposed over the well region 103. In addition, the well region 103 adjoins the isolation structures 105b and 105c. It should be noted that the isolation structure 105b between the active regions of the transistor 100 and the resistor 200 is closer to the resistor electrode 115b than the gate electrode 115a, in accordance with some embodiments.

Moreover, the semiconductor device structure 300a includes a dielectric layer 113' disposed over the semiconductor substrate 101, in accordance with some embodiments. In particular, the dielectric layer 113' has a first portion and a second portion below the top surface 101T of the semiconductor substrate 101, the first portion is between the gate electrode 115a and the semiconductor substrate 101, and the second portion is between the resistor electrode 115b and the semiconductor substrate 101. In some embodiments, the gate electrode 115a is separated from the semiconductor substrate 101 by the first portion of the dielectric layer 113', and the resistor electrode 115b is separated from the well region 103 in the semiconductor substrate 101 by the second portion of the dielectric layer 113'.

In addition, in some embodiments, the resistor electrode 115b is separated from the isolation structures 105b and 105c by the second portion of the dielectric layer 113'. In some embodiments, the isolation structures 105a, 105b and 105c are covered by the dielectric layer 113', and the S/D regions 121a and 121b are partially covered by the dielectric layer 113'.

Still referring to FIG. 1, the semiconductor device structure 300a includes an interlayer-dielectric (ILD) layer 123' disposed over the dielectric layer 113', and an interconnect structure 137 disposed over the ILD layer 123', in accordance with some embodiments. More specifically, the interconnect structure 137 includes a plurality of conductive vias 133a, 133b, 133c and 133d, and a plurality of conductive layers 135a, 135b and 135c.

In some embodiments, the conductive vias 133a, 133b, 133c and 133d are disposed in the ILD layer 123', and the conductive layers 135a, 135b and 135c are disposed over the ILD layer 123'. In some embodiments, the conductive vias 133a and 133b penetrate through the ILD layer 123' and the dielectric layer 113' to electrically connect the S/D regions 121a and 121b, and the conductive vias 133c and 133d penetrate through the ILD layer 123' to electrically connect the resistor electrode 115b. In particular, the conductive via 133a is disposed over the S/D region 121a, and the conductive layer 135a is disposed over the conductive via 133a. The S/D region 121a is electrically connected to the conductive layer 135a through the conductive via 133a, and the conductive layer 135a is used to electrically connect the S/D region 121a to other devices.

In some embodiments, the conductive via 133b is disposed over the S/D region 121b, the conductive via 133c is disposed over a portion of the resistor electrode 115b adjacent to the isolation structure 105b, and the conductive layer 135b is disposed over the conductive vias 133b and 133c. The conductive vias 133b and 133c are covered by the conductive layer 135b. It should be noted that the S/D region 121b of the transistor 100 is electrically connected to the resistor electrode 115b of the resistor 200 through the interconnect structure 137 (i.e., the conductive via 133b, the conductive layer 135b, and the conductive via 133c). Therefore, the transistor 100 and the resistor 200 are connected in series.

In some embodiments, the conductive via 133d is disposed over a portion of the resistor electrode 115b adjacent to the isolation structure 105c, and the conductive layer 135c is disposed over the conductive via 133d. The resistor electrode 115b is electrically connected to the conductive layer 135c through the conductive via 133d, and the conductive layer 135c is used to electrically connect the resistor 200 to other devices.

Figure 2:
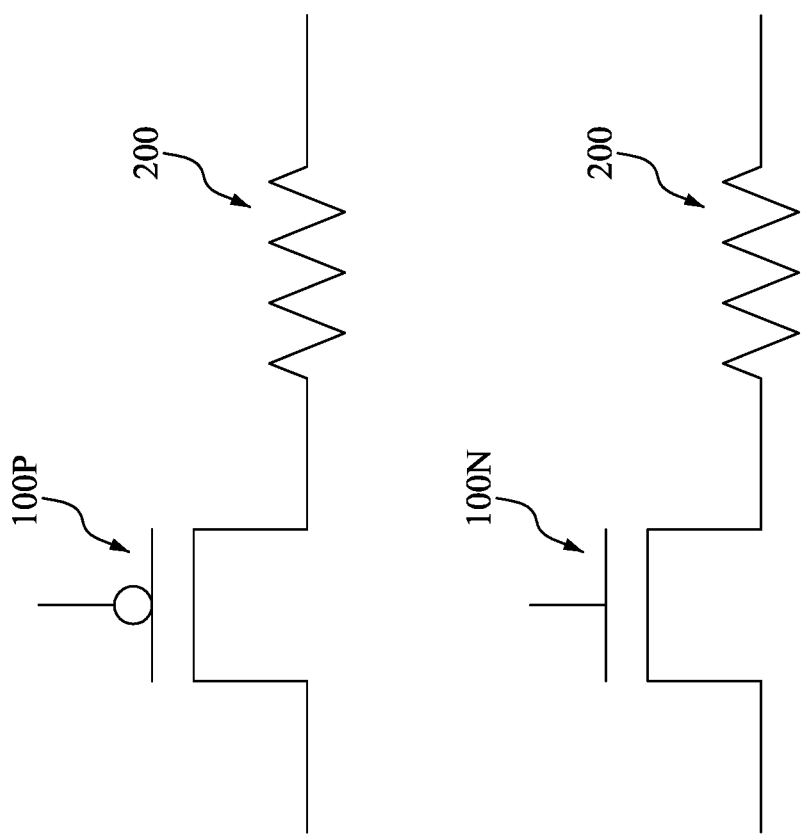
FIG. 2 is a circuit diagram of the semiconductor device structure in FIG. 1.

FIG. 2 is a circuit diagram of the semiconductor device structure 300a in FIG. 1. As shown in FIGS. 1 and 2, the transistor 100 of the semiconductor device structure 300a may be a P-type metal-oxide-semiconductor (PMOS) transistor 100P, and the PMOS transistor 100P and the resistor 200 are connected in series. Alternatively, the transistor 100 of the semiconductor device structure 300a may be an N-type metal-oxide-semiconductor (NMOS) transistor 100N, and the NMOS transistor 100N and the resistor 200 are connected in series.

Figure 3:
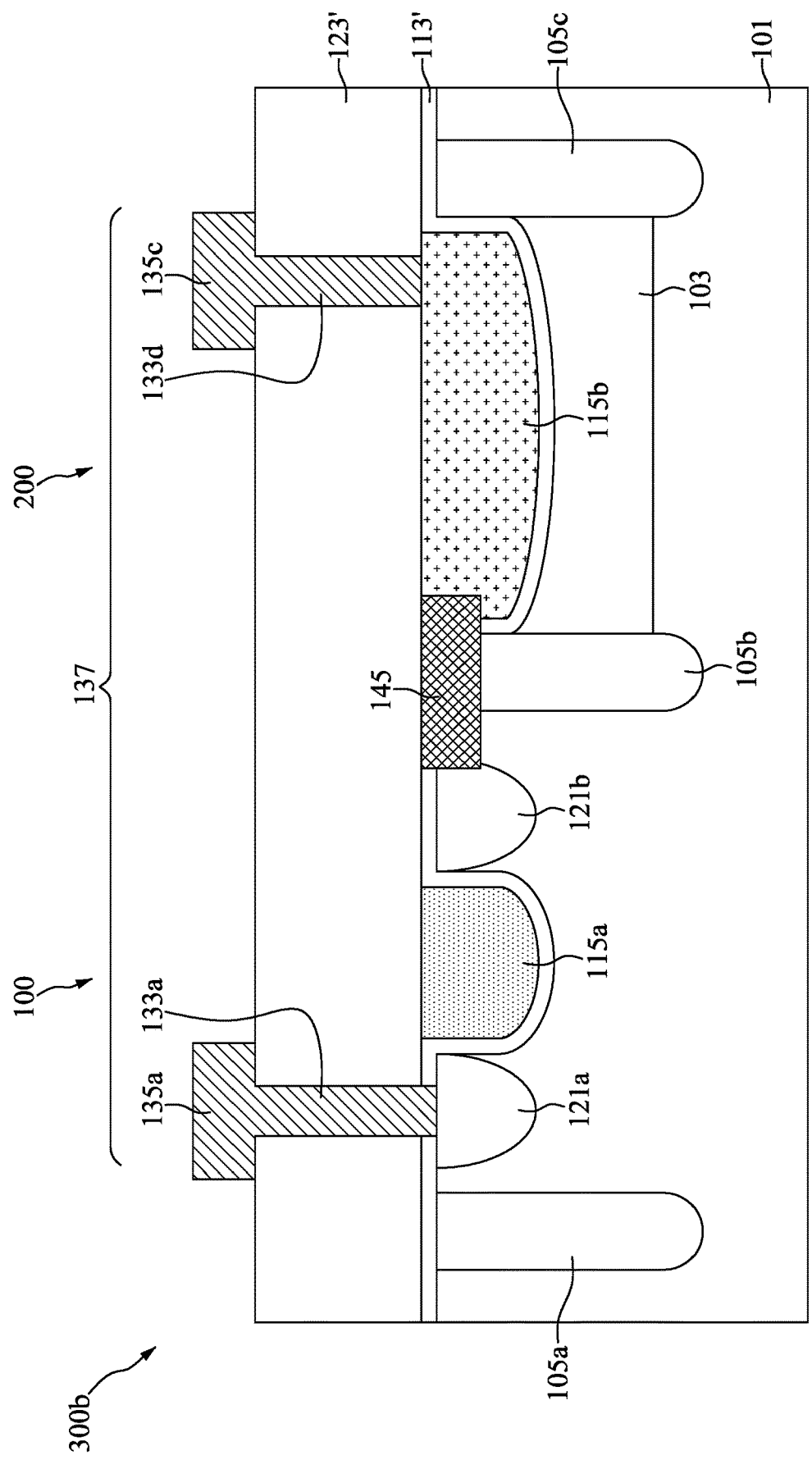
FIG. 3 is a cross-sectional view illustrating a modified semiconductor device structure, in accordance with some embodiments.

FIG. 3 is a cross-sectional view illustrating a modified semiconductor device structure 300b, in accordance with some embodiments. Similar to the semiconductor device structure 300a of FIG. 1, the semiconductor device structure 300b includes the transistor 100 and the resistor 200. The difference between the semiconductor device structures 300a and 300b is the connecting fashion of the transistor 100 and the resistor 200.

As shown in FIG. 3, the semiconductor device structure 300b includes a conductive structure 145 disposed in the semiconductor substrate 101 and over the isolation structure 105b, in accordance with some embodiments. In some embodiments, the conductive structure 145 is covered by the ILD layer 123', and the conductive structure 145 is disposed between the S/D region 121b of the transistor 100 and the resistor electrode 115b of the resistor 200. It should be noted that the S/D region 121b is electrically connected to the resistor electrode 115b through the conductive structure 145.

In some embodiments, the conductive structure 145 is in direct contact with the S/D region 121b and the resistor electrode 115b, and the conductive structure 145 is not covered by the dielectric layer 113'. Moreover, in some embodiments, the conductive vias 133b and 133c, and the conductive layer 135b are not formed in the semiconductor device structure 300b, and the interconnect structure 137 of the semiconductor device structure 300b includes the conductive vias 133a, 133d and the conductive layers 135a, 135c. FIG. 2 may be a circuit diagram represent the semiconductor device structure 300b shown in FIG. 3.

Figure 4:
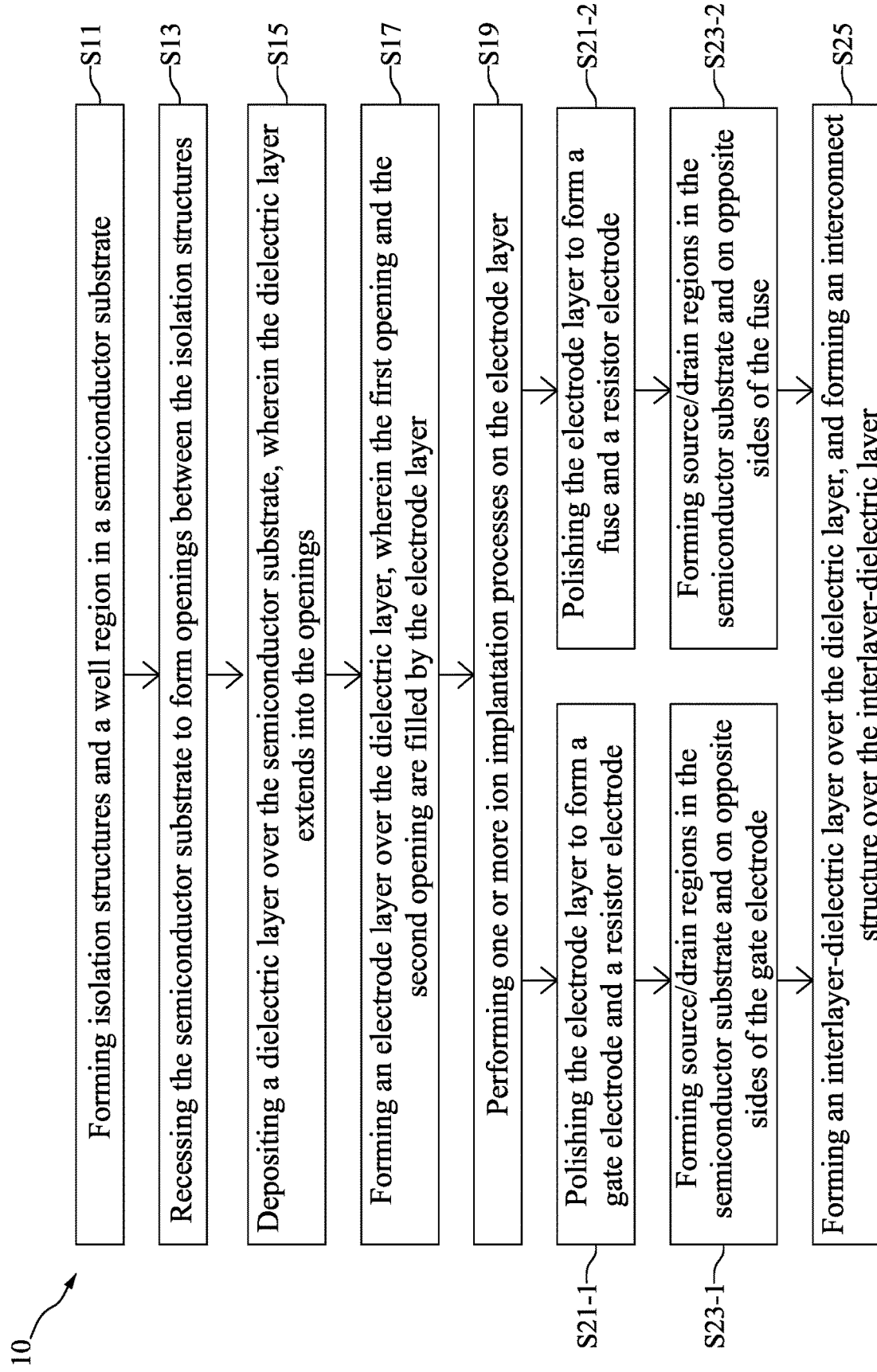
FIG. 4 is a flow diagram illustrating a method of forming a semiconductor device structure, in accordance with some embodiments.
Figure 25:
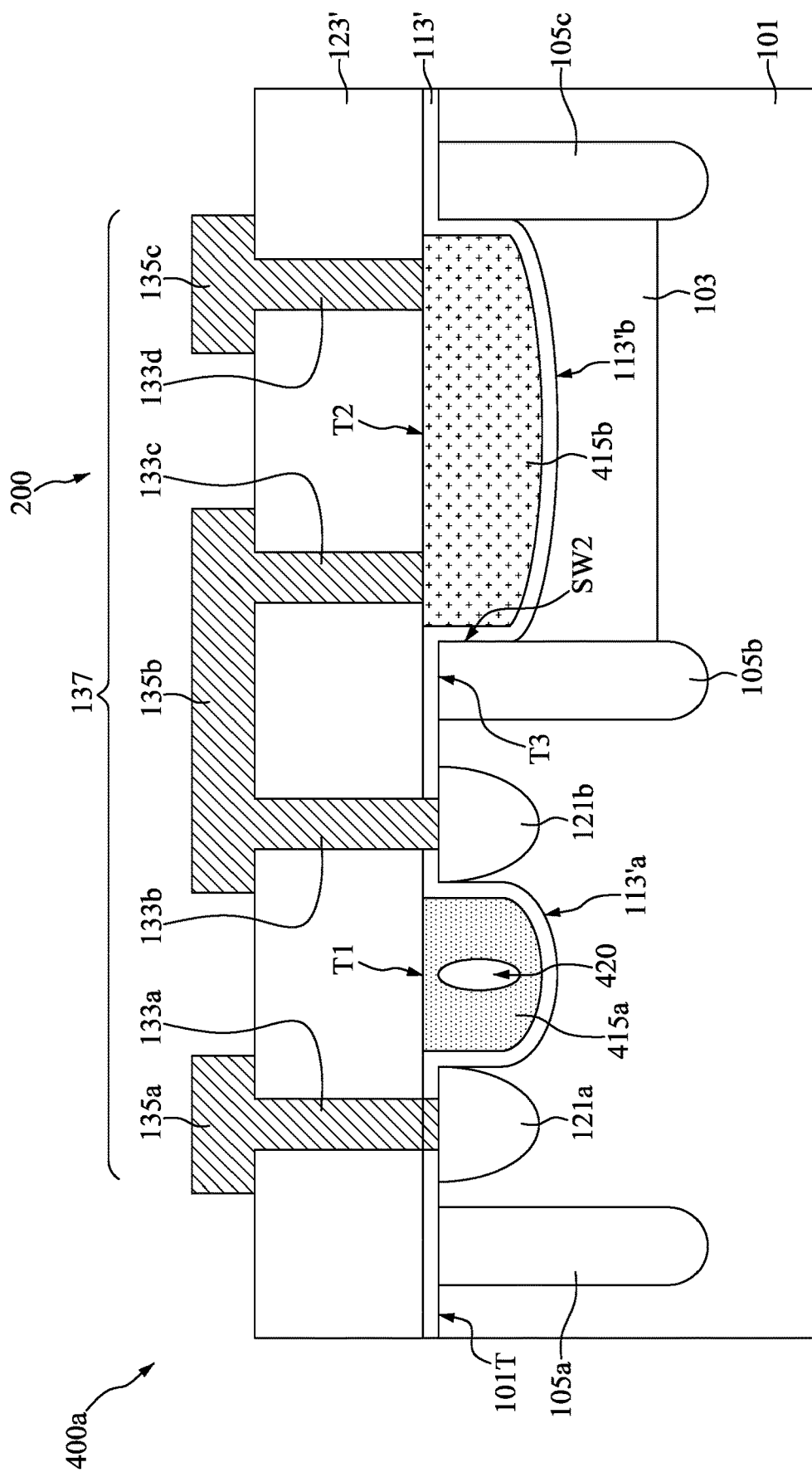
FIG. 25 is a cross-sectional view illustrating a semiconductor device structure, in accordance with some embodiments.
Figure 29:
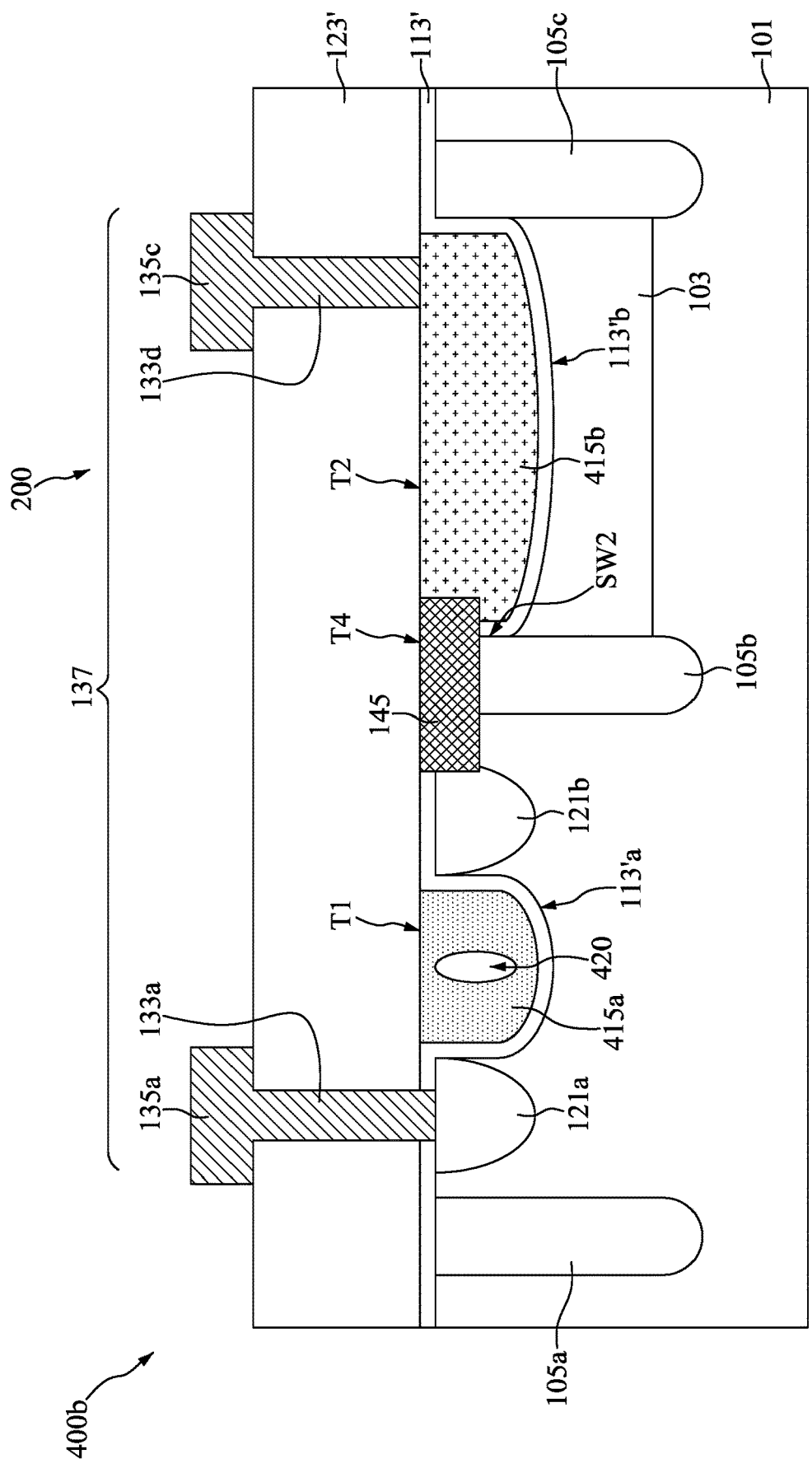
FIG. 29 is a cross-sectional view illustrating a modified semiconductor device structure, in accordance with some embodiments.

FIG. 4 is a flow diagram illustrating a method 10 of forming a semiconductor device structure (e.g., the semiconductor device structures 300a and 300b, the semiconductor device structure 400a shown in FIG. 25, the semiconductor device structure 400b shown in FIG. 29), and the method 10 includes steps S11, S13, S15, S17, S19, S21-1, S21-2, S23-1, S23-2 and S25, in accordance with some embodiments. The steps S11 to S25 of FIG. 4 are elaborated in connection with following figures.

FIGS. 5 to 15 are cross-sectional views illustrating intermediate stages in the formation of the semiconductor device structure 300a, in accordance with some embodiments.

Figure 5:
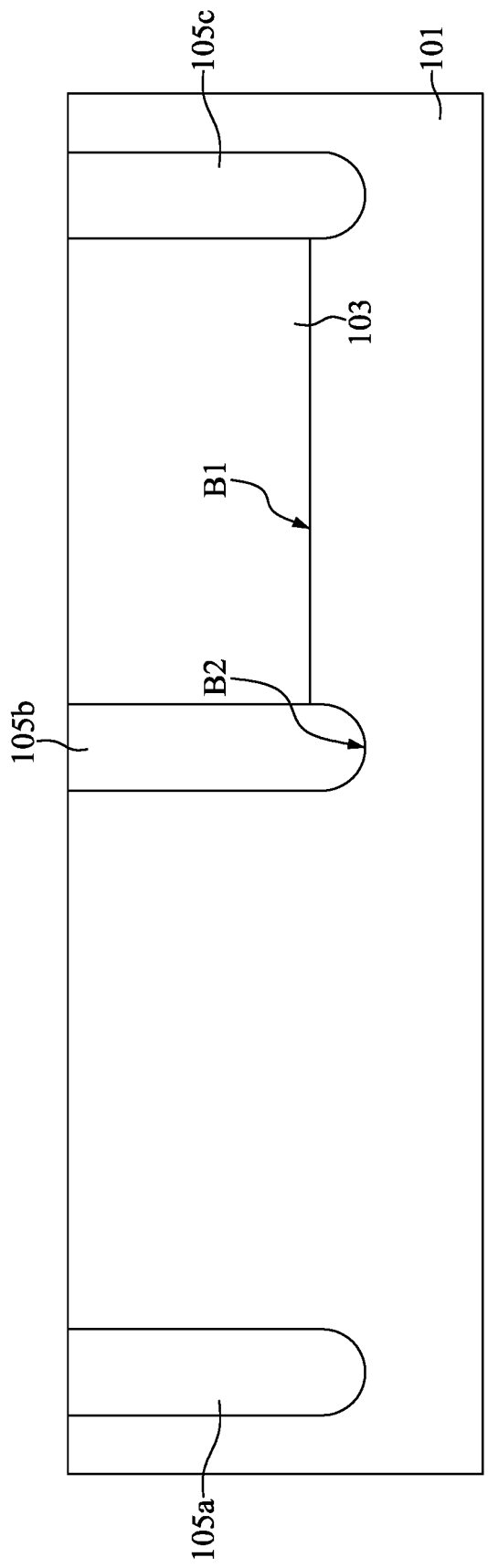
FIG. 5 is a cross-sectional view illustrating an intermediate stage of forming isolation structures and a well region during the formation of the semiconductor device structure, in accordance with some embodiments.

As shown in FIG. 5, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIG. 5, the isolation structures 105a, 105b, 105c are formed in the semiconductor substrate 101, and the well region 103 is formed between the isolation structures 105b and 105c, in accordance with some embodiments. In some embodiments, the isolation structures 105a, 105b and 105c are shallow trench isolation (STI) structures. In addition, the isolation structures 105a, 105b and 105c may be made of silicon oxide, silicon nitride, silicon oxynitride or another applicable dielectric material, and the formation of the isolation structures 105a, 105b and 105c may include forming a patterned mask (not shown) over the semiconductor substrate 101, etching the semiconductor substrate 101 to form openings (not shown) by using the patterned mask as a mask, depositing a dielectric material in the openings and over the semiconductor substrate 101, and polishing the dielectric material until the semiconductor substrate 101 is exposed.

In some embodiments, the well region 103 is formed by an ion implantation process, and P-type dopants, such as boron (B), gallium (Ga), or indium (In), or N-type dopants, such as phosphorous (P) or arsenic (As), can be implanted in the portion of the semiconductor substrate 101 between the isolation structures 105b and 105c to form the well region 103 (The ion implantation process may be performed by using a patterned mask covering the portion of the semiconductor substrate 101 between the isolation structures 105a and 105b). The respective step is illustrated as the step S11 in the method 10 shown in FIG. 4.

In some embodiments, the isolation structures 105a, 105b and 105c are formed before the well region 103. In some other embodiments, the well region 103 is formed before the isolation structures 105a, 105b and 105c. In addition, the bottom surface B1 of the well region 103 is higher than the bottom surface B2 of the isolation structures 105a, 105b and 105c, in accordance with some embodiments.

Figure 6:
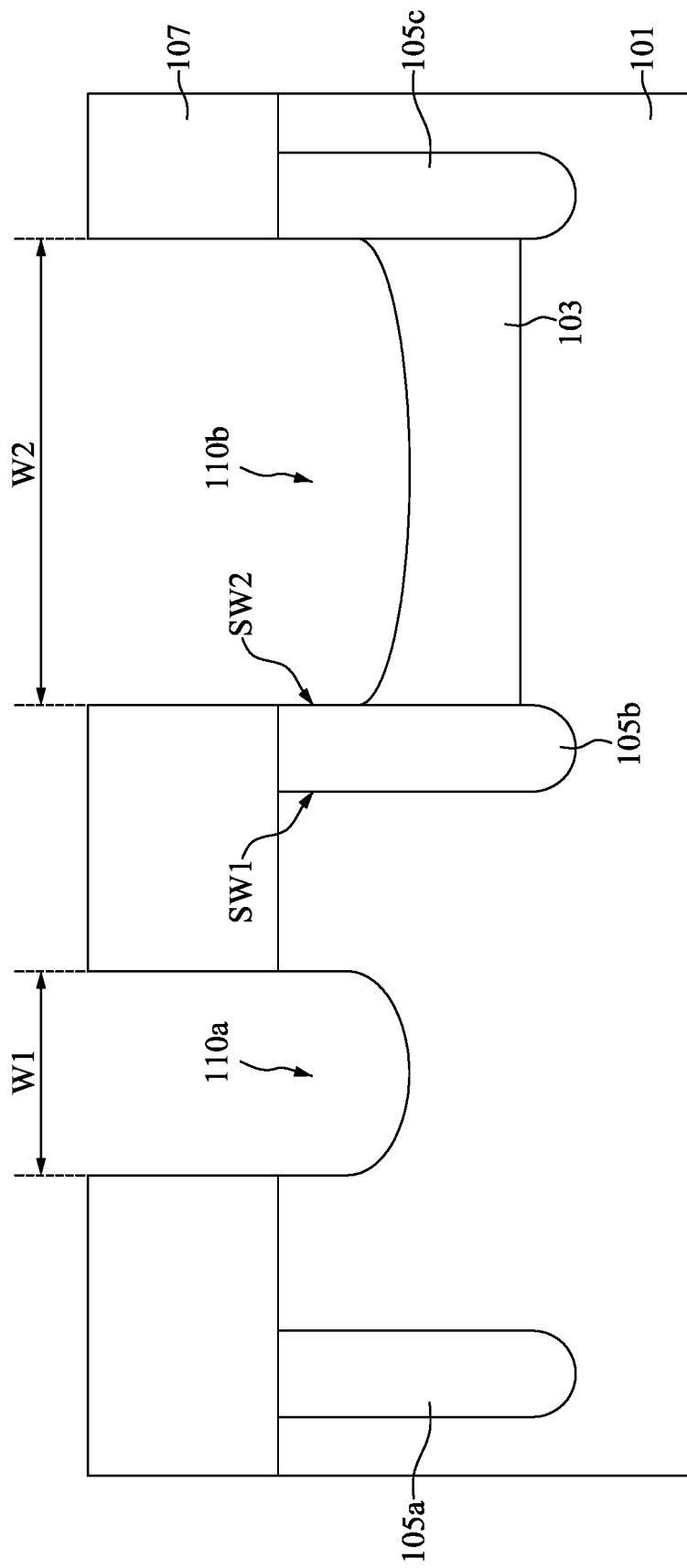
FIG. 6 is a cross-sectional view illustrating an intermediate stage of forming openings between the isolation structures during the formation of the semiconductor device structure, in accordance with some embodiments.

Next, a patterned mask 107 is formed over the semiconductor substrate 101, and the semiconductor substrate 101 is recessed to form openings 110a and 110b by using the patterned mask 107 as an etching mask, as shown in FIG. 6 in accordance with some embodiments. In some embodiments, the opening 110a is located between the isolation structures 105a and 105b, and the opening 110b is located between the isolation structures 105b and 105b. The respective step is illustrated as the step S13 in the method 10 shown in FIG. 4.

The patterned mask 107 may be formed by a deposition process and a patterning process. The deposition process for forming the patterned mask 107 may be a chemical vapor deposition (CVD) process, a high-density plasma CVD (HDPCVD) process, a spin-coating process, or another applicable process. The patterning process for forming the patterned mask 107 may include a photolithography process and an etching process. The photolithography process may include photoresist coating (e.g., spin-coating), soft baking, mask aligning, exposure, post-exposure baking, developing the photoresist, rinsing and drying (e.g., hard baking). The etching process may include a dry etching process or a wet etching process.

After the patterned mask 107 is formed, the portions of the semiconductor substrate 101 exposed by the patterned mask 107 are partially removed by an etching process. The etching process may be a wet etching process, a dry etching process, or a combination thereof. In some embodiments, the opening 110b is formed by removing an upper portion of the well region 103, such that the opening 110b is formed over the resulting well region 103.

In some embodiments, the sidewalls of the isolation structures 105b and 105c are partially exposed by the opening 110b. For example, the isolation structure 105b has a first sidewall SW1 facing the isolation structure 105a and a second sidewall SW2 facing the isolation structure 105c. The first sidewall SW1 is covered by the semiconductor structure 101 while the second sidewall SW2 is partially exposed by the opening 110b. Moreover, the opening 110a has a width W1, the opening 110b has a width W2, and the width W2 is greater than the width W1, in accordance with some embodiments. After the openings 110a and 110b are formed, the patterned mask 107 may be removed.

Figure 7:
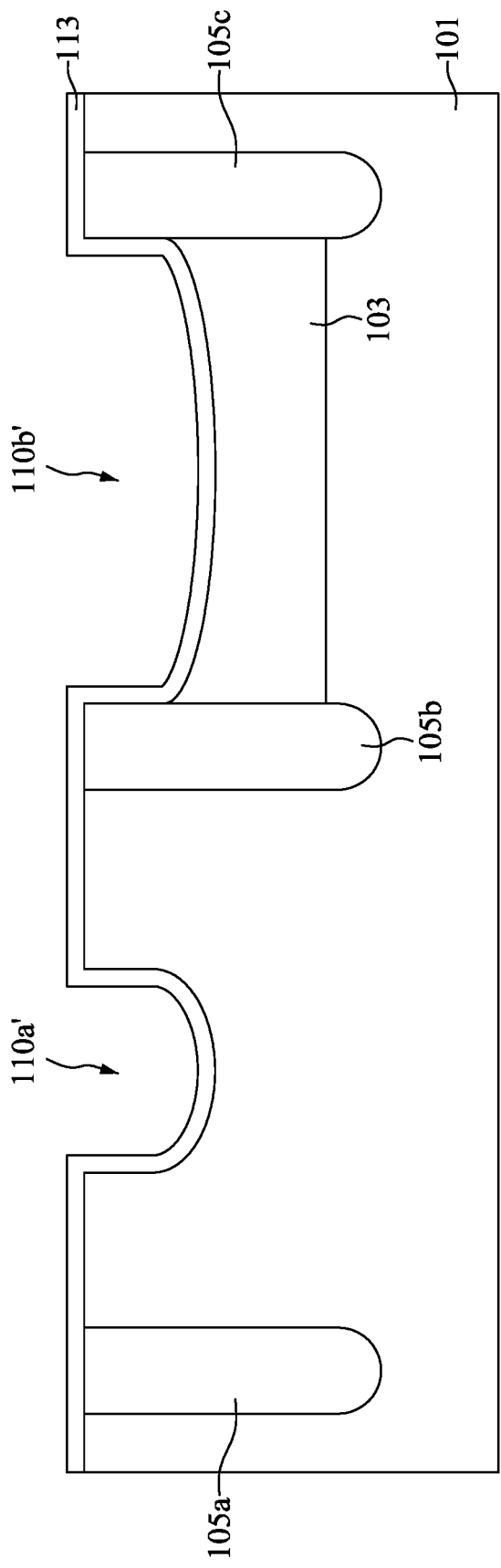
FIG. 7 is a cross-sectional view illustrating an intermediate stage of forming a dielectric layer during the formation of the semiconductor device structure, in accordance with some embodiments.

The dielectric layer 113 is deposited over the semiconductor substrate 101, as shown in FIG. 7 in accordance with some embodiments. In some embodiments, the dielectric layer 113 is deposited conformally in the openings 110a and 110b, such as on the sidewalls and the bottom surfaces of the openings 110a and 110b, and the isolation structures 105a, 105b and 105c are covered by the dielectric layer 113. The respective step is illustrated as the step S15 in the method 10 shown in FIG. 4. After the dielectric layer 113 is formed, reduced openings 110a' and 110b' are obtained.

In some embodiments, the dielectric layer 113 includes silicon oxide, silicon nitride, silicon oxynitride, or multilayers thereof. In some embodiments, the dielectric layer 113 is made of a high-k dielectric material, such as hafnium oxide, lanthanum oxide, aluminum oxide, zirconium oxide, or the like. In addition, the dielectric layer 113 may be deposited by a conformal deposition process, such as a CVD process, an atomic layer deposition (ALD) process, a plasma-enhanced CVD (PECVD) process, another applicable process, or a combination thereof.

Figure 8:
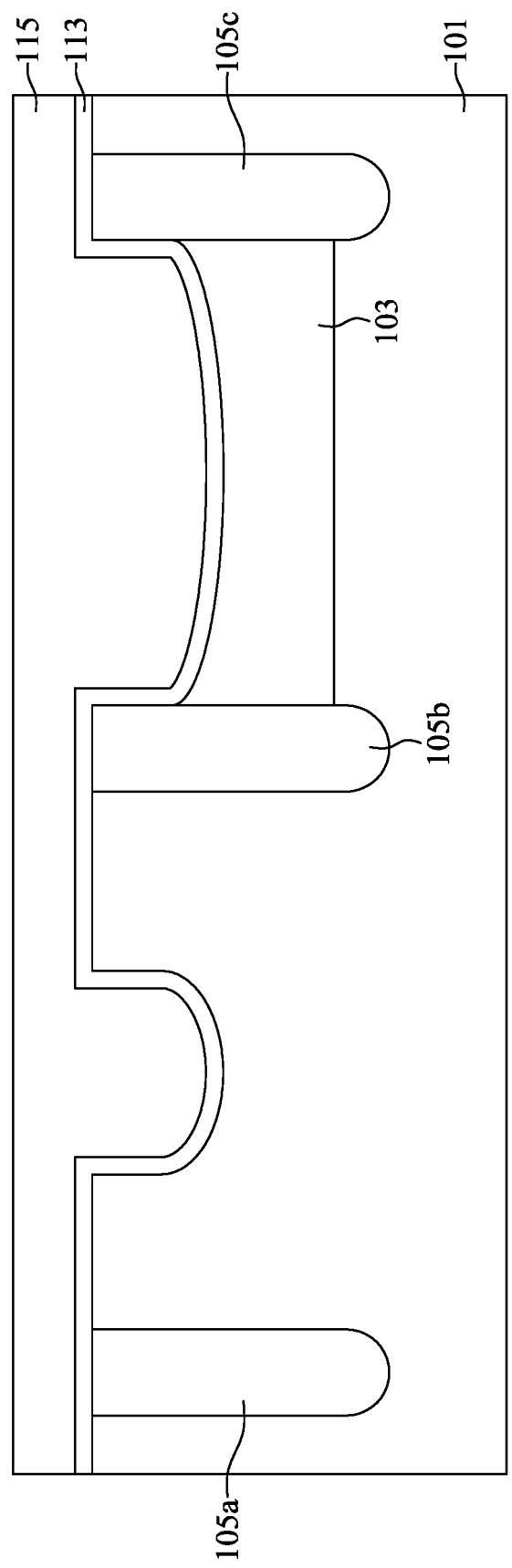
FIG. 8 is a cross-sectional view illustrating an intermediate stage of forming an electrode layer during the formation of the semiconductor device structure, in accordance with some embodiments.

After the dielectric layer 113 is formed, an electrode layer 115 is formed over the dielectric layer 113, and the openings 110a' and 110b' (see FIG. 7) in the semiconductor substrate 101 are filled by the electrode layer 115, as shown in FIG. 8 in accordance with some embodiments. The respective step is illustrated as the step S17 in the method 10 shown in FIG. 4.

In some embodiments, the electrode layer 115 is made of a semiconductor material such as polysilicon. In some embodiments, the electrode layer 115 is deposited over the dielectric layer 113 using a CVD process, an ALD process, a sputtering process, or one or more other applicable processes.

Figure 9:
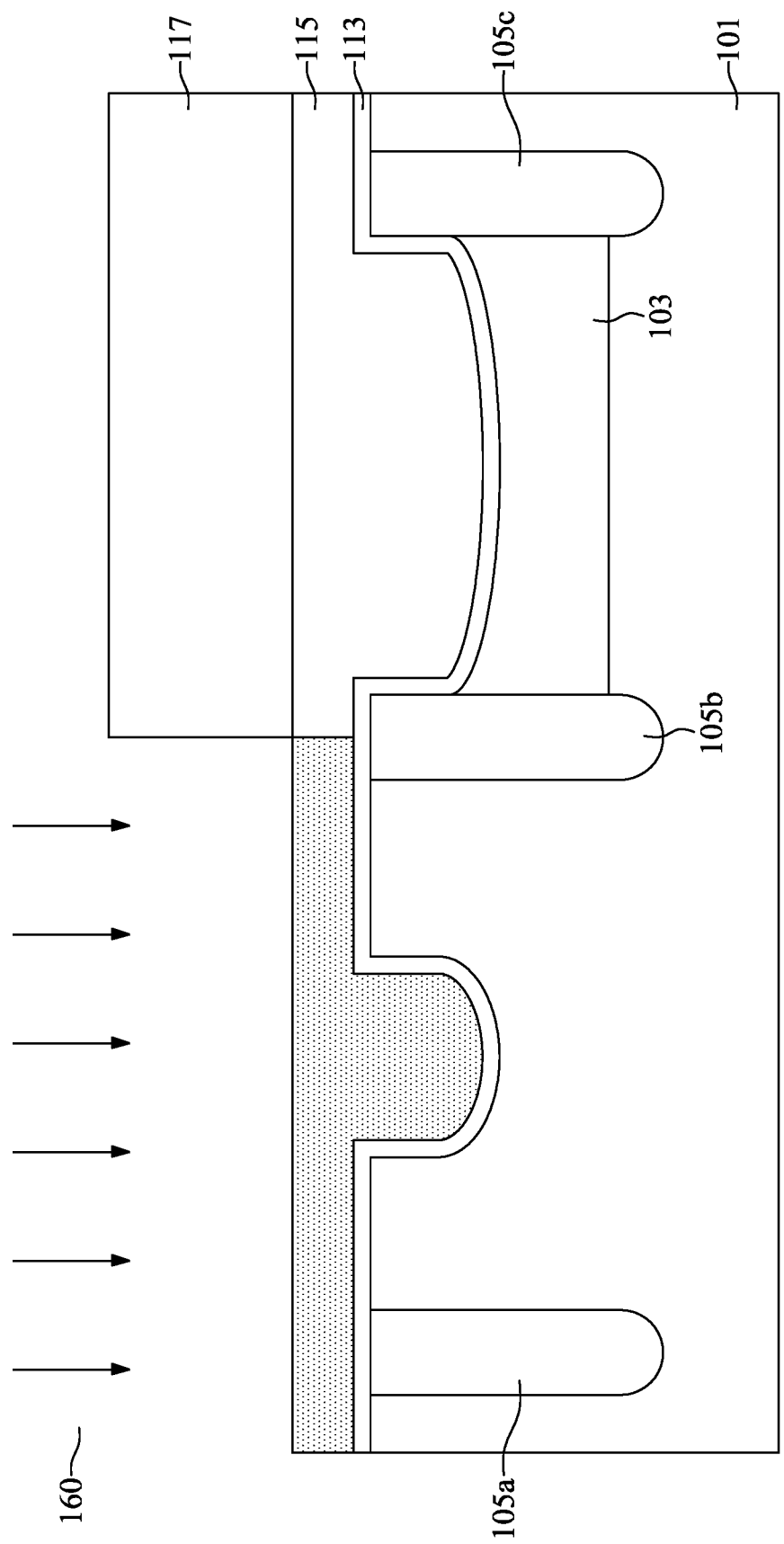
FIG. 9 is a cross-sectional view illustrating an intermediate stage of performing an ion implantation process on the electrode layer during the formation of the semiconductor device structure, in accordance with some embodiments.

Next, a patterned mask 117 is formed to cover the active region between the isolation structures 105b and 105c (i.e., the active region of the subsequently-formed resistor 200), and an ion implantation process 160 is performed on the portion of the electrode layer 115 exposed by the patterned mask 117, as shown in FIG. 9 in accordance with some embodiments. In some embodiments, the portion of the electrode layer 115 over the well region 103 is covered by the patterned mask 117.

Some processes used to form the patterned mask 117 are similar to, or the same as, those used to form the patterned mask 107 (see FIG. 6), and details thereof are not repeated herein. During the ion implantation process 160, P-type dopants, such as boron (B), gallium (Ga), or indium (In), or N-type dopants, such as phosphorous (P) or arsenic (As), are introduced into the electrode layer 115 using the patterned mask 117 as an implantation mask. After the ion implantation process 160, the patterned mask 117 may be removed.

Figure 10:
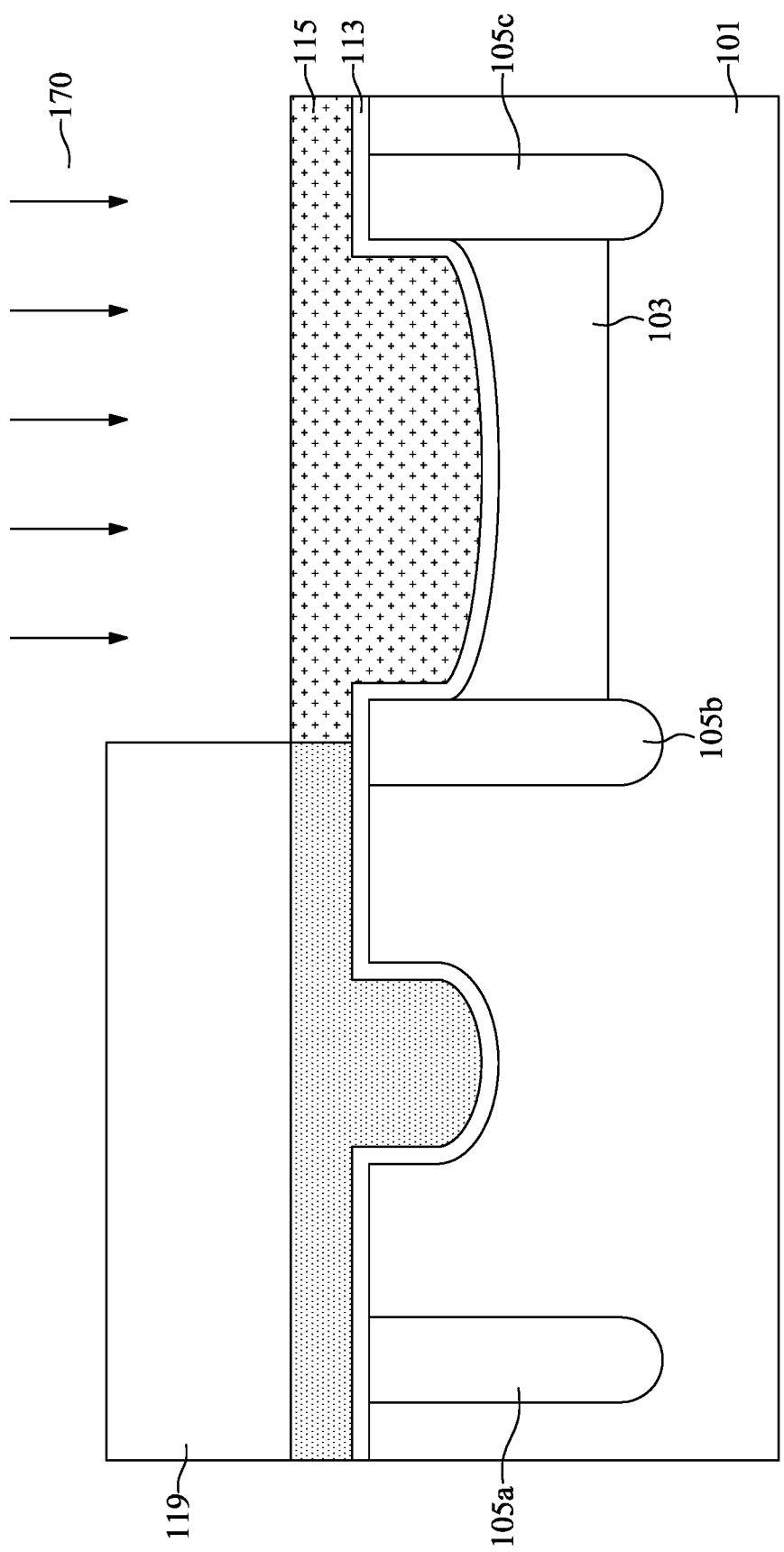
FIG. 10 is a cross-sectional view illustrating an intermediate stage of performing an ion implantation process on the electrode layer during the formation of the semiconductor device structure, in accordance with some embodiments.

Then, a patterned mask 119 is formed to cover the active region between the isolation structures 105a and 105b (i.e., the active region of the subsequently-formed transistor 100), and an ion implantation process 170 is performed on the portion of the electrode layer 115 exposed by the patterned mask 119, as shown in FIG. 10 in accordance with some embodiments. In alternative embodiments, the ion implantation process 170 is performed before the ion implantation process 160. The respective step is illustrated as the step S19 in the method 10 shown in FIG. 4.

Some processes used to form the patterned mask 119 are similar to, or the same as, those used to form the patterned mask 107 (see FIG. 6), and details thereof are not repeated herein. During the ion implantation process 170, P-type dopants, such as boron (B), gallium (Ga), or indium (In), or N-type dopants, such as phosphorous (P) or arsenic (As), are introduced into the electrode layer 115 using the patterned mask 119 as an implantation mask.

It should be noted that the portion of the electrode layer 115 between the isolation structures 105a and 105b is heavily doped compared with the portion of the electrode layer 115 between the isolation structures 105b and 105c for increased conductivity, in accordance with some embodiments. In some embodiments, the dose amount of the ion implantation process 160 is greater than the dose amount of the ion implantation process 170. After the ion implantation process 170, the patterned mask 119 may be removed. In addition, an annealing process may be used to activate the implanted dopants.

Figure 11:
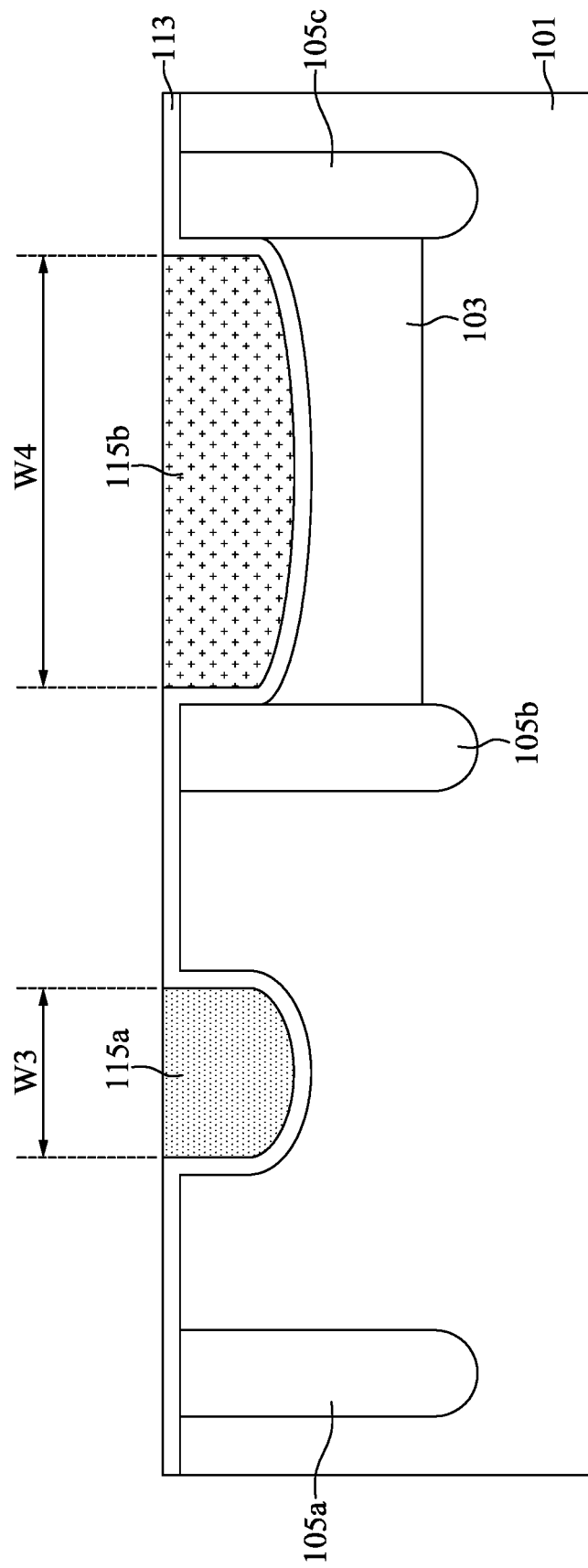
FIG. 11 is a cross-sectional view illustrating an intermediate stage of polishing the electrode layer during the formation of the semiconductor device structure, in accordance with some embodiments.

Subsequently, a polishing process is performed on the electrode layer 115 to form the gate electrode 115a in the opening 110a' (see FIG. 7) and the resistor electrode 115b in the opening 110b' (see FIG. 7), as shown in FIG. 11 in accordance with some embodiments. In some embodiments, the polishing process is performed until the dielectric layer 113 is exposed, and the excess portion of the electrode layer 115 over the dielectric layer 113 is removed. The respective step is illustrated as the step S21-1 in the method 10 shown in FIG. 4.

In some embodiments, the polishing process is a chemical mechanical polishing (CMP) process. In some embodiments, the gate electrode 115a has a width W3, the resistor electrode 115b has a width W4, and the width W4 is greater than the width W3. Moreover, the required conductivity of the gate electrode 115a is higher than the required conductivity of the resistor electrode 115b. Therefore, as mentioned above, a dopant concentration of the gate electrode 115a is greater than a dopant concentration of the resistor electrode 115b.

Figure 12:
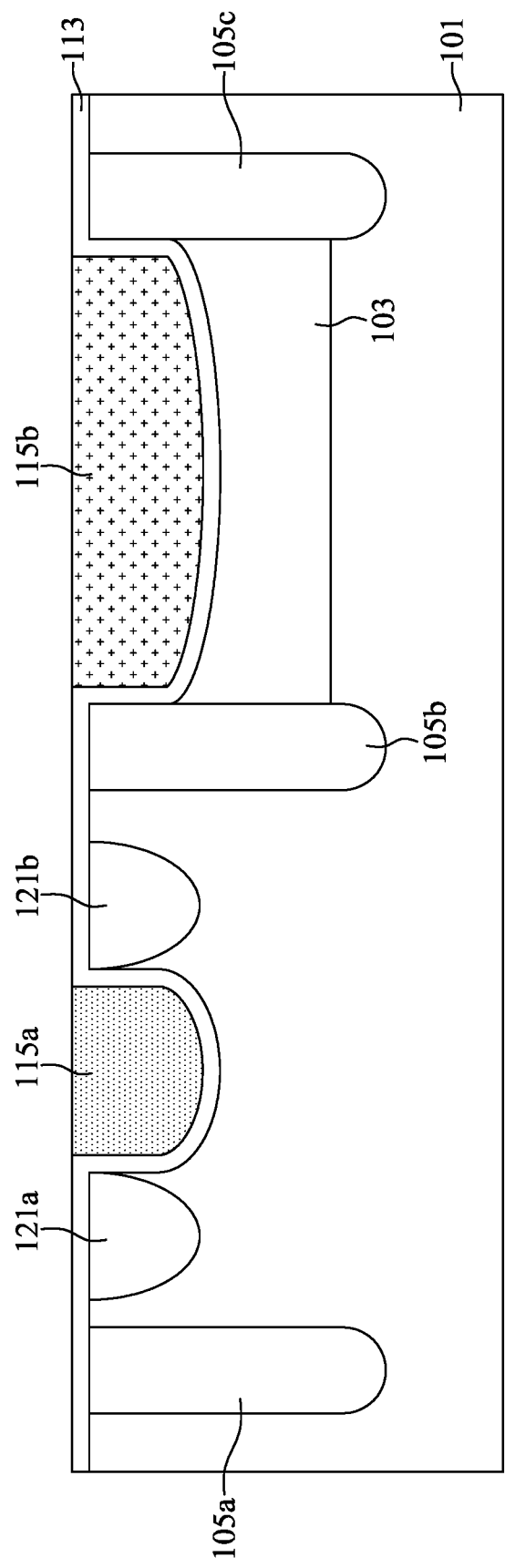
FIG. 12 is a cross-sectional view illustrating an intermediate stage of forming source/drain regions during the formation of the semiconductor device structure, in accordance with some embodiments.

After the gate electrode 115a and the resistor electrode 115b are formed, the S/D regions 121a and 121b are formed in the semiconductor substrate 101 and on opposite sides of the gate electrode 115a, as shown in FIG. 12 in accordance with some embodiments. The S/D regions 121a and 121b may be formed by ion implantation and/or diffusion, and an annealing process, such as a rapid thermal annealing (RTA) process, may be used to activate the implanted dopants. The respective step is illustrated as the step S23-1 in the method 10 shown in FIG. 4.

In some embodiments, the S/D regions 121a and 121b, and the well region 103 are doped with one or more P-type dopants, such as boron (B), gallium (Ga), or indium (In). In alternative embodiments, the S/D regions 121a and 121b, and the well region 103 are doped with one or more N-type dopants, such as phosphorous (P) or arsenic (As).

Figure 13:
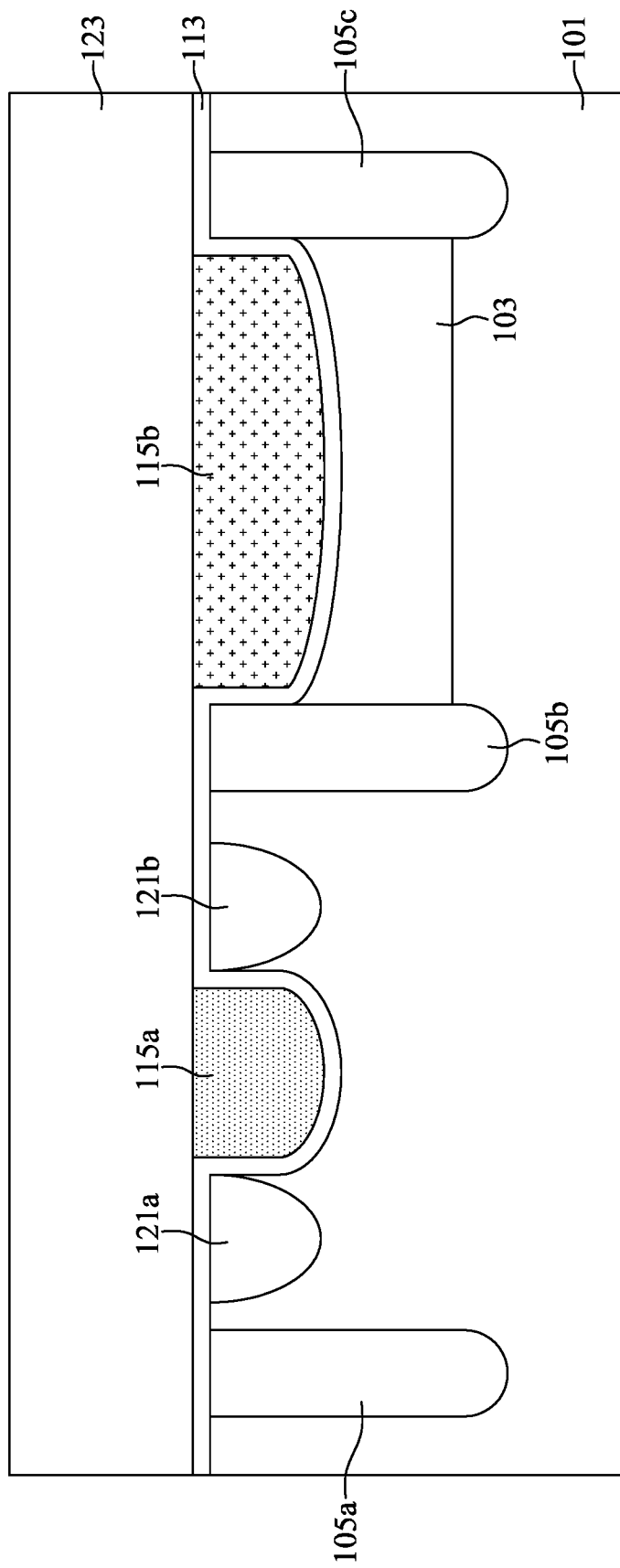
FIG. 13 is a cross-sectional view illustrating an intermediate stage of forming an interlayer-dielectric layer during the formation of the semiconductor device structure, in accordance with some embodiments.

An ILD layer 123 is formed over the structure of FIG. 12, as shown in FIG. 13 in accordance with some embodiments. In some embodiments, the ILD layer 123 is made of silicon oxide, silicon nitride, silicon oxynitride, phosphosilicate glass (PSG), borophosphosilicate glass (BPSG), low-k dielectric material, and/or other applicable dielectric materials. In addition, the ILD layer 123 may be formed by a CVD process, a physical vapor deposition (PVD) process, an ALD process, a spin-coating process, or another applicable process.

Figure 14:
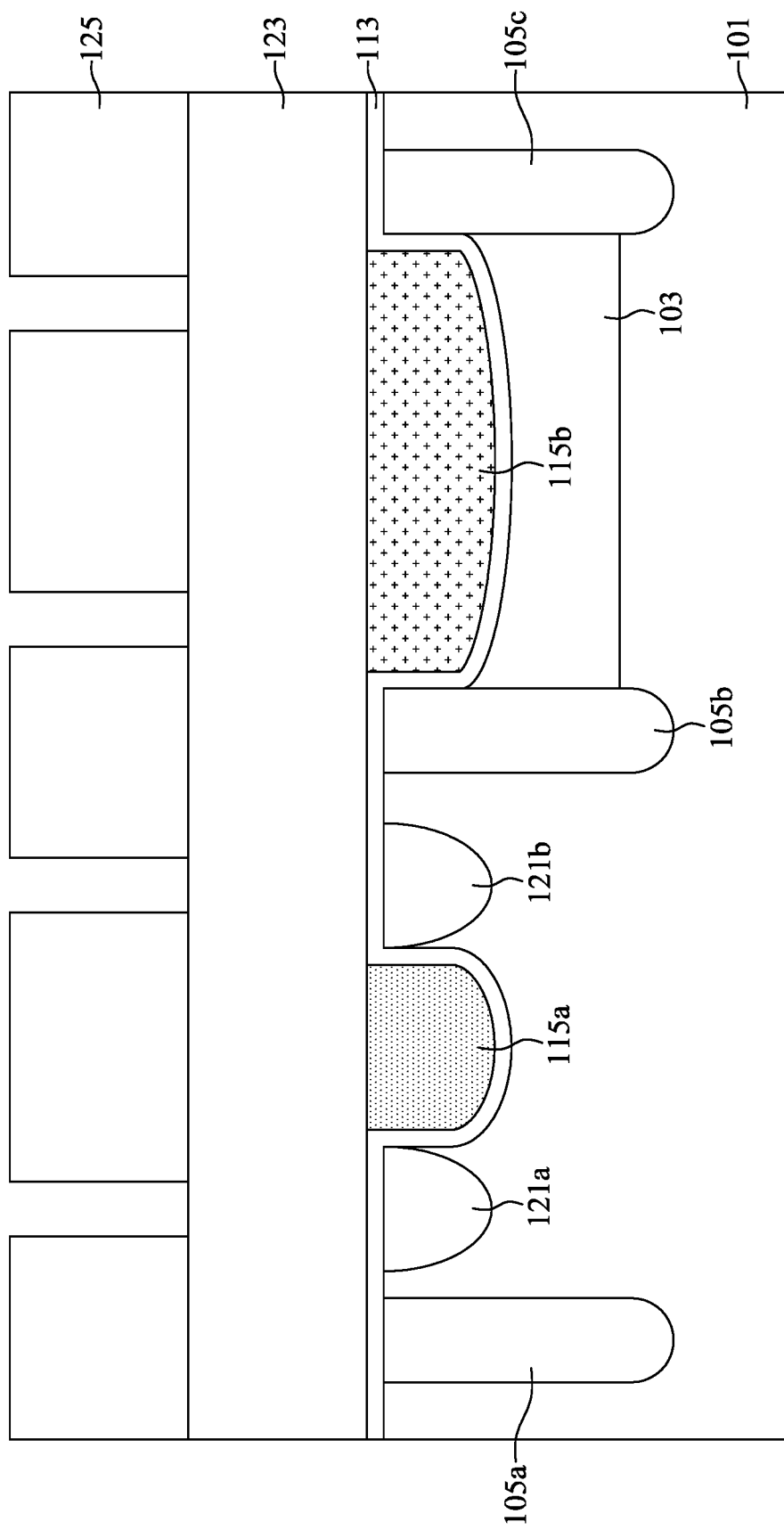
FIG. 14 is a cross-sectional view illustrating an intermediate stage of forming a patterned mask over the interlayer-dielectric layer during the formation of the semiconductor device structure, in accordance with some embodiments.

Next, a patterned mask 125 is formed over the ILD layer 123, as shown in FIG. 14 in accordance with some embodiments. In some embodiments, the patterned mask 125 has openings, and portions of the ILD layer 123 are exposed by the openings of the patterned mask 125. Some processes used to form the patterned mask 125 are similar to, or the same as, those used to form the patterned mask 107 (see FIG. 6), and details thereof are not repeated herein.

Figure 15:
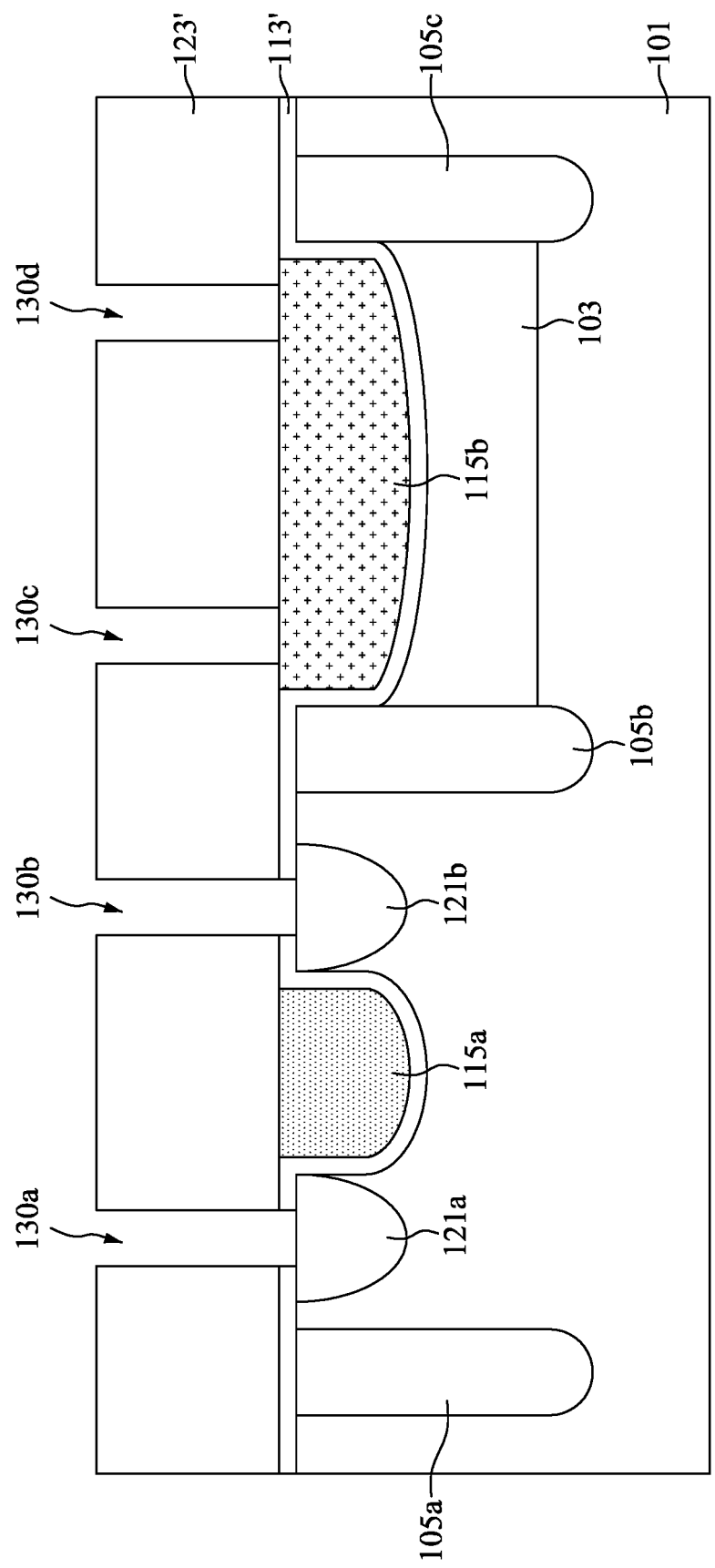
FIG. 15 is a cross-sectional view illustrating an intermediate stage of partially removing the interlayer-dielectric layer and the dielectric layer during the formation of the semiconductor device structure, in accordance with some embodiments.

Then, an etching process is performed on the ILD layer 123 and the dielectric layer 113 using the patterned mask 125 as a mask, as shown in FIG. 15 in accordance with some embodiments. After the etching process, openings 130a, 130b, 130c and 130d are formed. In some embodiments, openings 130a and 130b penetrate through the ILD layer 123 and the dielectric layer 113, and the S/D regions 121a and 121b are exposed by the openings 130a and 130b, respectively. In some embodiments, the openings 130c and 130d penetrate through the ILD layer 123, and the resistor electrode 115b are partially exposed by the openings 130c and 130d. After the openings 130a, 130b, 130c and 130d are formed, an etched ILD layer 123' and an etched dielectric layer 113' are obtained.

Referring back to FIG. 1, the interconnect structure 137 is formed over the ILD layer 123', in accordance with some embodiments. As mentioned above, the interconnect structure 137 includes the conductive vias 133a, 133b, 133c and 133d, and the conductive layers 135a, 135b and 135c. In some embodiments, the conductive vias 133a, 133b, 133c and 133d are formed in the openings 130a, 130b, 130c and 130d, respectively, and the conductive layers 135a, 135b and 135c are formed over the ILD layer 123' to cover the conductive vias 133a, 133b, 133c and 133d. The respective step is illustrated as the step S25 in the method 10 shown in FIG. 4.

In some embodiments, the interconnect structure 137 is made of copper (Cu), copper alloy, aluminum (Al), aluminum alloy, tungsten (W), tungsten alloy, titanium (Ti), titanium alloy, tantalum (Ta), tantalum alloy, or a combination thereof. Alternatively, other applicable conductive materials may be used. Moreover, the interconnect structure 137 may be formed by one or more deposition process, and a subsequent patterning process. The deposition process may be a CVD process, a PVD process, an ALD process, a metal organic CVD (MOCVD) process, a sputtering process, a plating process, or another applicable deposition process, and the patterning process may include a photolithography process and an etching process. In some embodiments, the interconnect structure 137 includes multilayers.

Figure 16:
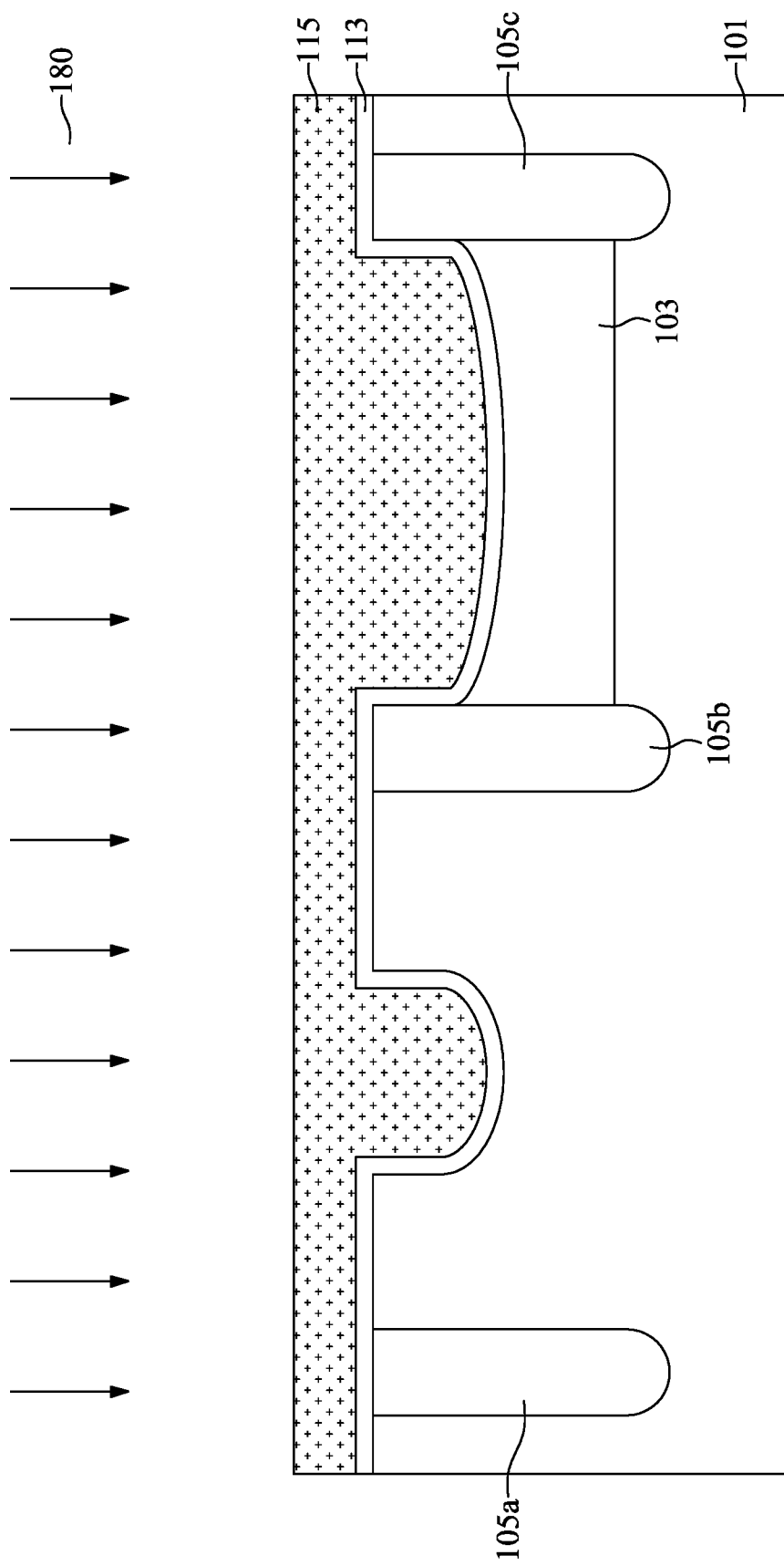
FIG. 16 is a cross-sectional view illustrating an intermediate stage of performing an ion implantation process on the electrode layer during the formation of the semiconductor device structure, in accordance with some embodiments.
Figure 17:
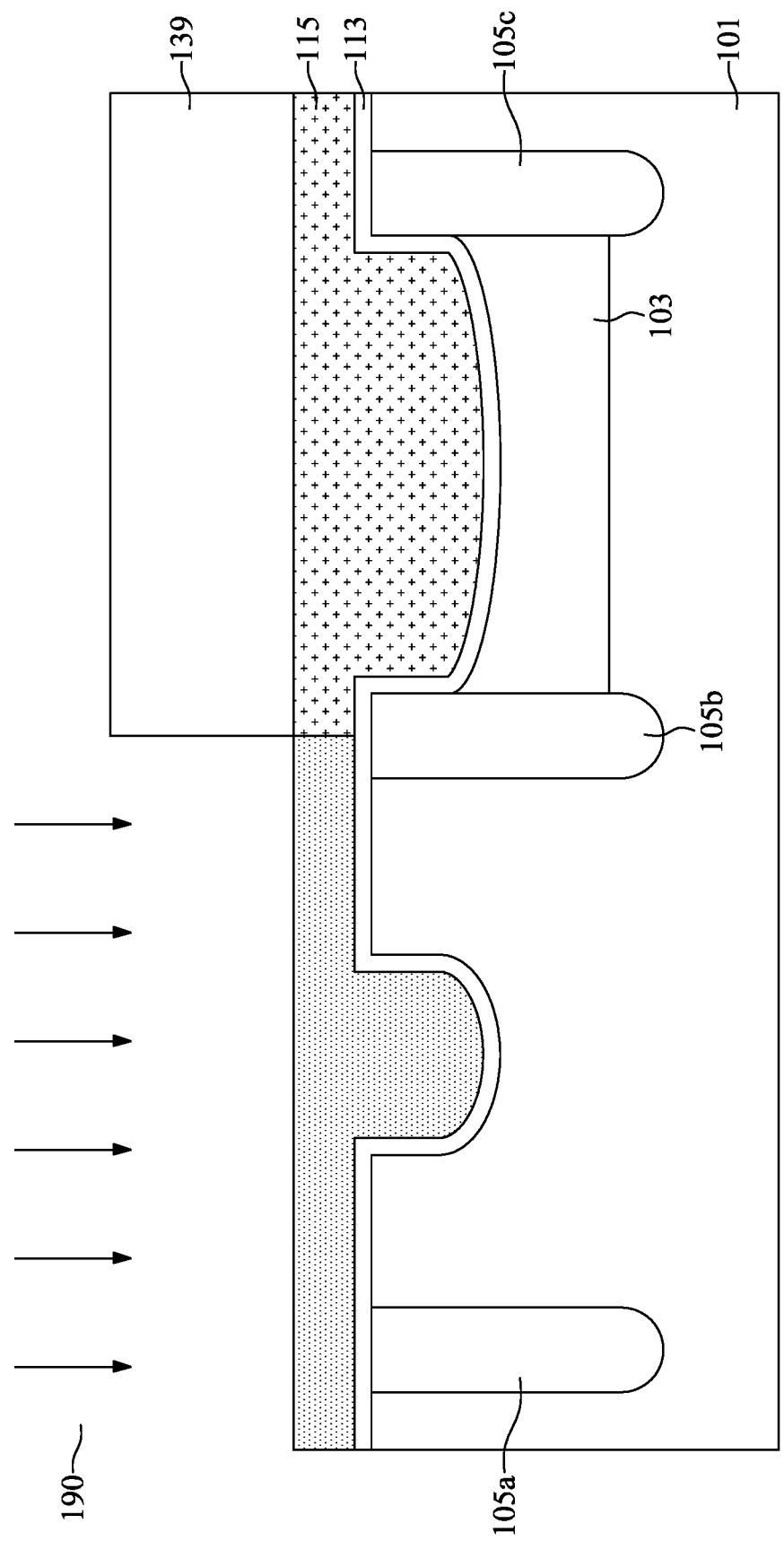
FIG. 17 is a cross-sectional view illustrating an intermediate stage of performing an ion implantation process on the electrode layer during the formation of the semiconductor device structure, in accordance with some embodiments.

FIGS. 16 to 17 are cross-sectional views illustrating intermediate stages in the formation of the semiconductor device structure 300a, in accordance with some other embodiments.

In alternative embodiments, the ion implantation processes 160 and 170 (see FIGS. 9 and 10) are replaced by ion implantation processes 180 and 190, as shown in FIGS. 16 and 17 in accordance with some embodiments. As shown in FIG. 16, the ion implantation process 180 is performed on the structure of FIG. 8 without using any implantation mask.

Subsequently, a patterned mask 139 is formed to cover the active region between the isolation structures 105b and 105c (i.e., the active region of the subsequently-formed resistor 200), and the ion implantation process 190 is performed on the portion of the electrode layer 115 exposed by the patterned mask 139, as shown in FIG. 17 in accordance with some embodiments. Some processes used to form the patterned mask 139 are similar to, or the same as, those used to form the patterned mask 107 (see FIG. 6), and details thereof are not repeated herein.

It should be noted that the portion of the electrode layer 115 between the isolation structures 105a and 105b are ion-implanted one time more than the portion of the electrode layer 115 between the isolation structures 105b and 105c. Therefore, the dopant concentration of the portion of the electrode layer 115 between the isolation structures 105a and 105b is greater than the dopant concentration of the portion of the electrode layer 115 between the isolation structures 105b and 105c. As a consequence, the dopant concentration of the gate electrode 115a is greater than a dopant concentration of the resistor electrode 115b in the resulting semiconductor device structure 300a.

Figure 18:
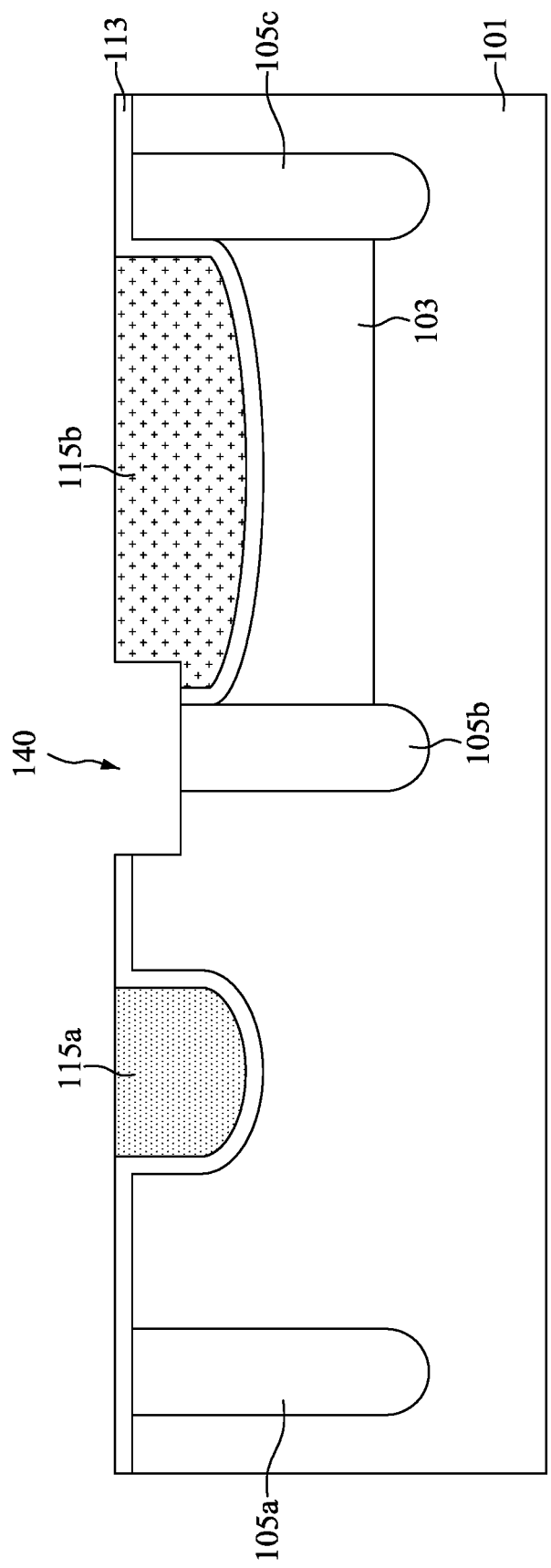
FIG. 18 is a cross-sectional view illustrating an intermediate stage of forming an opening in the semiconductor substrate during the formation of the semiconductor device structure, in accordance with some embodiments.
Figure 19:
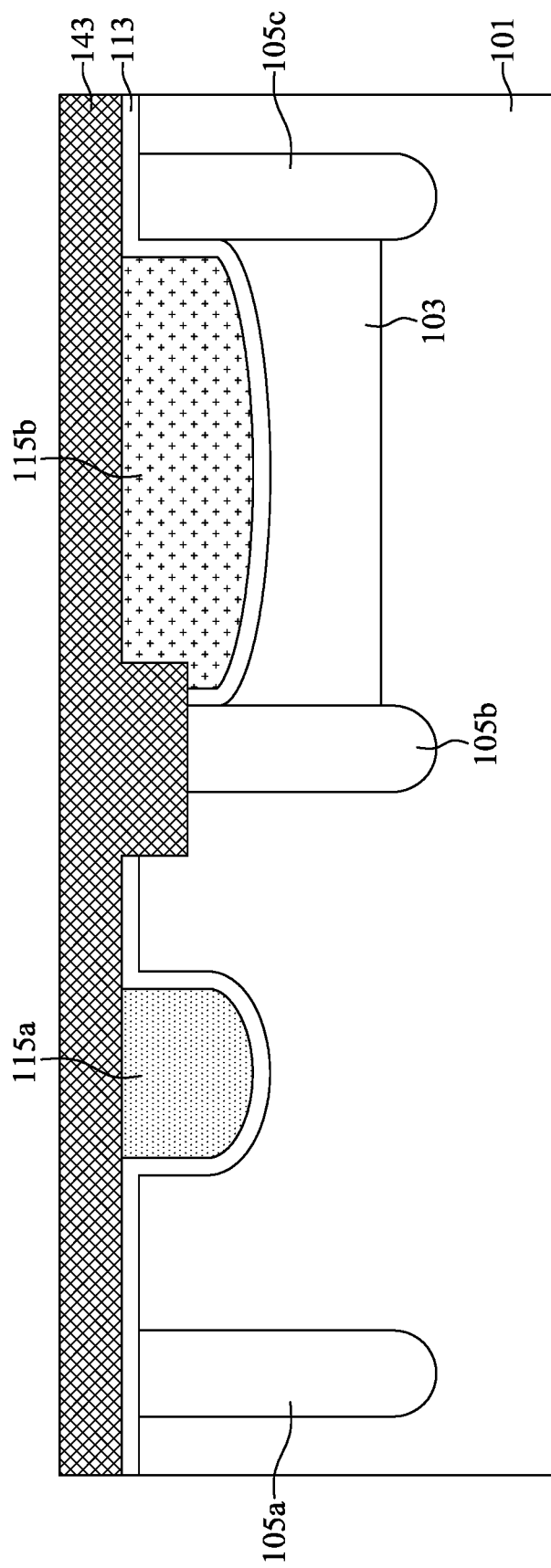
FIG. 19 is a cross-sectional view illustrating an intermediate stage of forming a conductive layer during the formation of the semiconductor device structure, in accordance with some embodiments.
Figure 20:
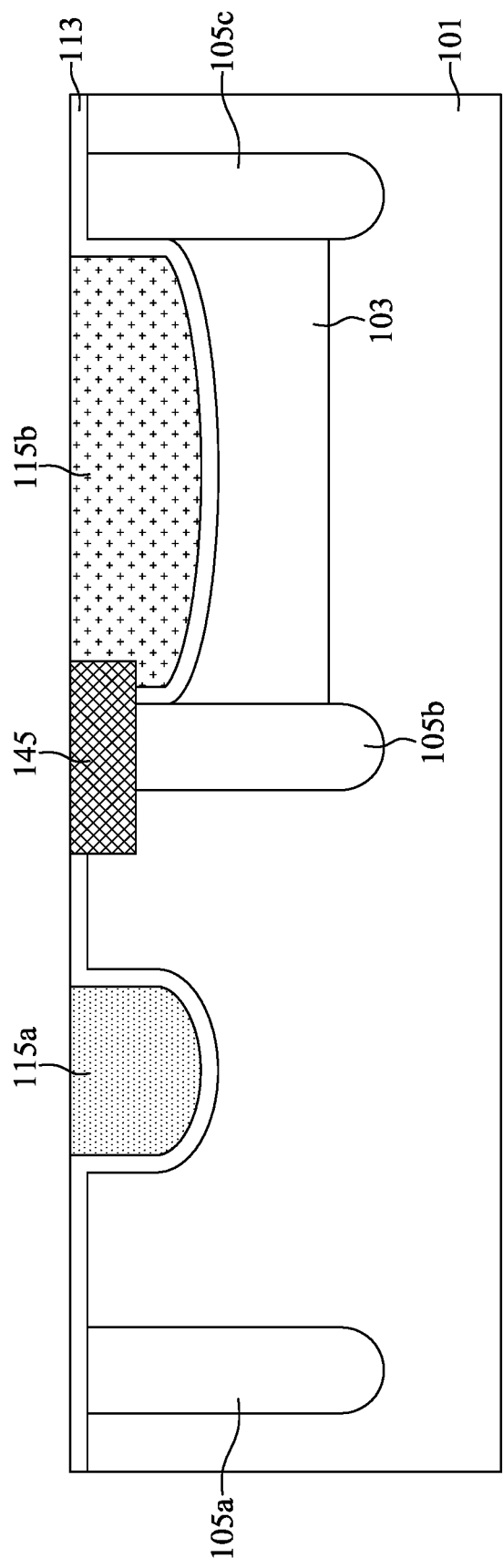
FIG. 20 is a cross-sectional view illustrating an intermediate stage of forming a conductive structure during the formation of the semiconductor device structure, in accordance with some embodiments.

FIGS. 18 to 20 are cross-sectional views illustrating intermediate stages in the formation of the modified semiconductor device structure 300b, in accordance with some embodiments.

As shown in FIG. 18, an upper portion of the isolation structure 105b is etched to form an opening 140 after the electrode layer 115 is polished (see FIG. 11), in accordance with some embodiments. The opening 140 may be formed by using a patterned mask (not shown) as an etching mask. In some embodiments, the dielectric layer 113, the semiconductor substrate 101, the resistor electrode 115b are partially etched to form the opening 140.

Next, a conductive layer 143 is formed over the dielectric layer 113, and the opening 140 is filled by the conductive layer 143, as shown in FIG. 19 in accordance with some embodiments. In some embodiments, the conductive layer 143 is in direct contact with the resistor electrode 115b.

In some embodiments, the conductive layer 143 is made of copper (Cu), copper alloy, aluminum (Al), aluminum alloy, tungsten (W), tungsten alloy, titanium (Ti), titanium alloy, tantalum (Ta), tantalum alloy, another applicable conductive material, or a combination thereof. In addition, the conductive layer 143 may be formed by a CVD process, a PVD process, an ALD process, a plating process, a sputtering process, or another applicable process.

After the conductive layer 143 is formed, a planarization process is performed to expose the gate electrode 115a and the resistor electrode 115b, and the conductive structure 145 is formed in the semiconductor substrate 101 and over the isolation structure 105b, as shown in FIG. 20 in accordance with some embodiments. The planarization process for forming the conductive structure 145 may include a CMP process, a grinding process, an etching process, another suitable process, or a combination thereof.

After the planarization process, the top surfaces of the dielectric layer 113, the gate electrode 115a, the resistor electrode 115b, and the conductive structure 145 are substantially coplanar with each other, in accordance with some embodiments. Within the context of this disclosure, the word "substantially" means preferably at least 90%, more preferably 95%, even more preferably 98%, and most preferably 99%.

Subsequently, the processes of FIGS. 12 to 15 used to form the semiconductor device structure 300a are performed on the structure of FIG. 20. As mentioned above, since the connecting fashion of the transistor 100 and the resistor 200 are different between the semiconductor device structures 300a and 300b, the openings 130b and 130c (see FIG. 15) are not formed in the ILD layer 123', such that the interconnect structure 137 of the semiconductor device structure 300b (see FIG. 3) only includes the conductive vias 133a, 133d, and the conductive layers 135a, 135c. However, in some other embodiments, the interconnect structure 137 of the semiconductor device structure 300b includes other conductive elements for electrically connecting with other devices.

Figure 21:
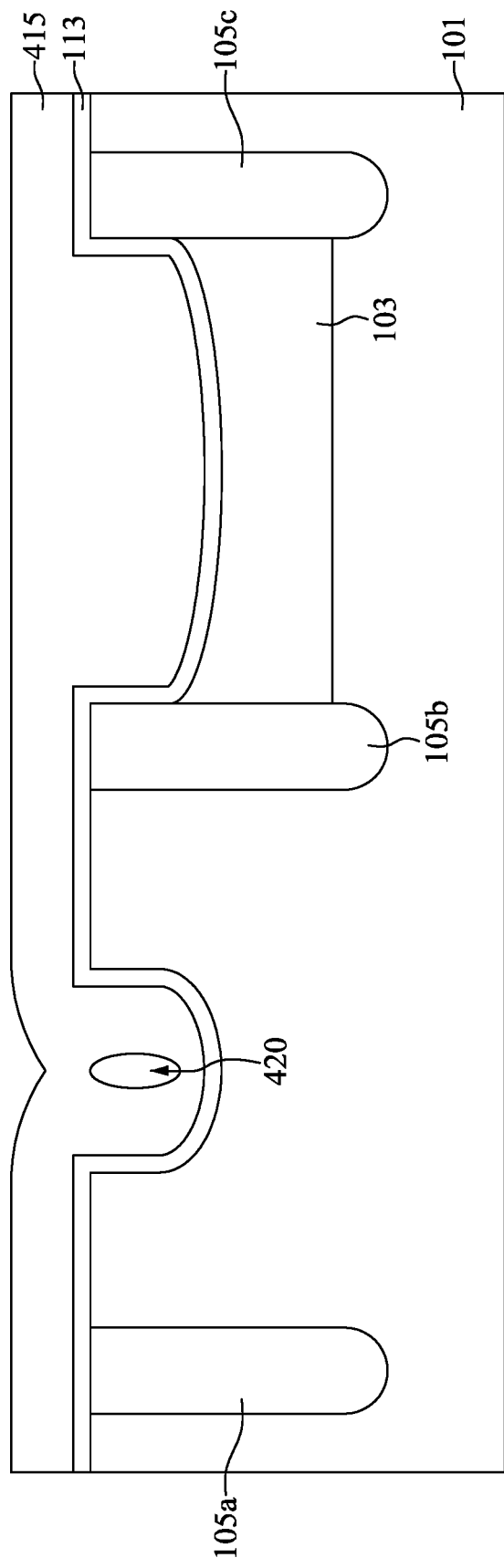
FIG. 21 is a cross-sectional view illustrating an intermediate stage of forming an electrode layer during the formation of the semiconductor device structure, in accordance with some embodiments.

FIGS. 21 to 24 are cross-sectional views illustrating intermediate stages in the formation of a semiconductor device structure 400a shown in FIG. 25, in accordance with some embodiments. It should be pointed out that operations for forming the semiconductor device structure 400a before the structure shown in FIG. 21 are substantially the same as the operations for forming the semiconductor device structure 300a shown in FIGS. 5-7 (The respective steps are illustrated as the steps S11 to S15 in the method 10 shown in FIG. 4), and the related detailed descriptions may refer to the foregoing paragraphs and are not discussed again herein.

After the dielectric layer 113 is formed, an electrode layer 415 is formed over the dielectric layer 113, as shown in FIG. 21 in accordance with some embodiments. In some embodiments, the openings 110a' and 110b' (see FIG. 7) in the semiconductor substrate 101 are filled by the electrode layer 415, and an air gap 420 is enclosed (or sealed) in the portion of the electrode layer 415 in the opening 110a'. In other words, the air gap 420 is not exposed. The respective step is illustrated as the step S17 in the method 10 shown in FIG. 4.

In some embodiments, the electrode layer 415 is made of a semiconductor material such as polysilicon. In some embodiments, the electrode layer 415 is deposited over the dielectric layer 113 using a CVD process, an ALD process, a sputtering process, or one or more other applicable processes.

Figure 22:
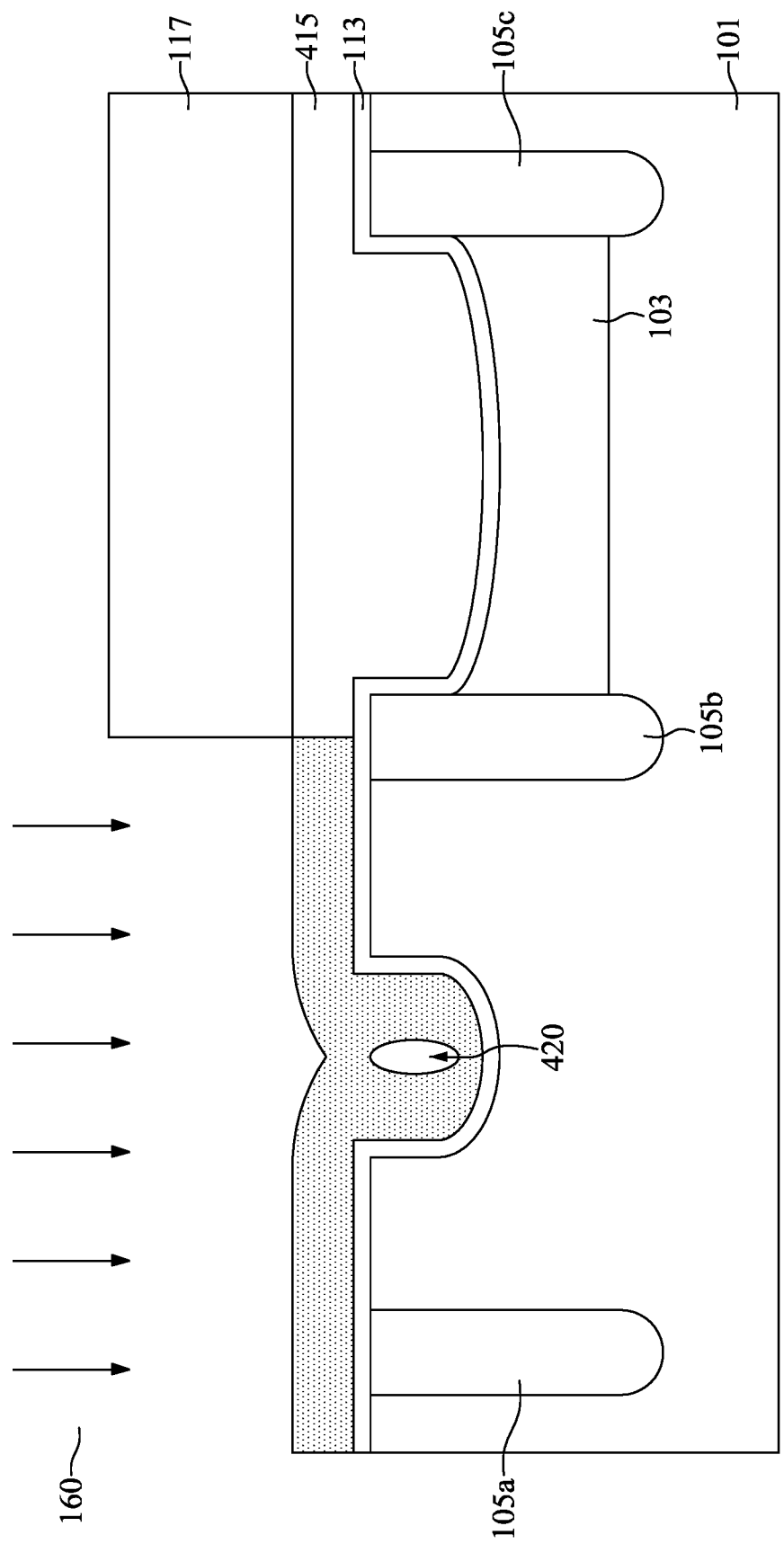
FIG. 22 is a cross-sectional view illustrating an intermediate stage of performing an ion implantation process on the electrode layer during the formation of the semiconductor device structure, in accordance with some embodiments.

Next, similar to the operation shown in FIG. 9, a patterned mask 117 is formed to cover the active region between the isolation structures 105b and 105c (i.e., the active region of the subsequently-formed resistor 200), and an ion implantation process 160 is performed on the portion of the electrode layer 415 exposed by the patterned mask 117, as shown in FIG. 22 in accordance with some embodiments. In some embodiments, the portion of the electrode layer 415 over the well region 103 is covered by the patterned mask 117.

Some processes used to form the patterned mask 117 in FIG. 22 are similar to, or the same as, those used to form the patterned mask 107 in FIG. 6, and details thereof are not repeated herein. During the ion implantation process 160, P-type dopants, such as boron (B), gallium (Ga), or indium (In), or N-type dopants, such as phosphorous (P) or arsenic (As), are introduced into the electrode layer 415 using the patterned mask 117 as an implantation mask. After the ion implantation process 160, the patterned mask 117 may be removed.

Figure 23:
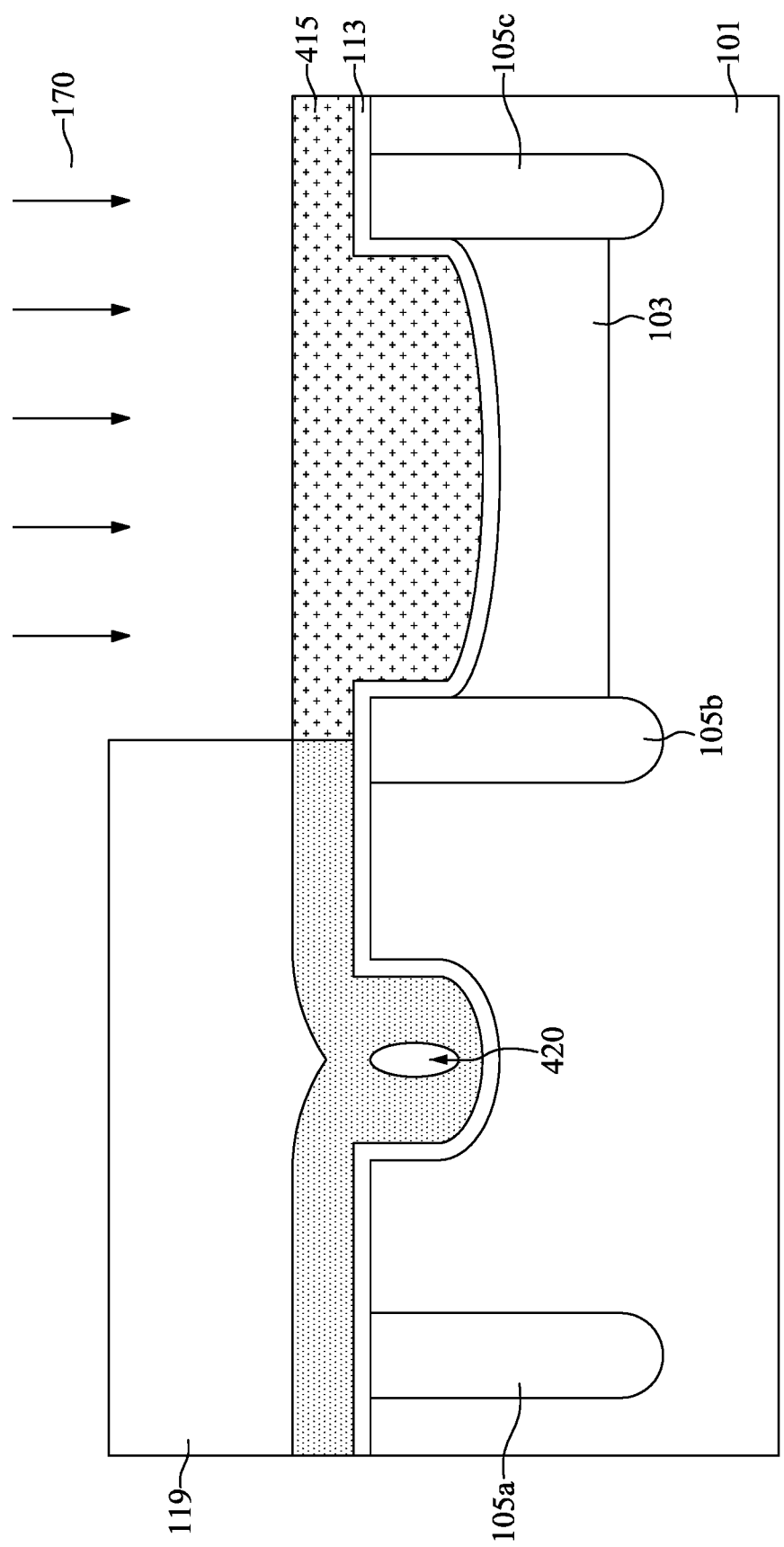
FIG. 23 is a cross-sectional view illustrating an intermediate stage of performing an ion implantation process on the electrode layer during the formation of the semiconductor device structure, in accordance with some embodiments.

Then, similar to the operation shown in FIG. 10, a patterned mask 119 is formed to cover the active region between the isolation structures 105a and 105b, and an ion implantation process 170 is performed on the portion of the electrode layer 415 exposed by the patterned mask 119, as shown in FIG. 23 in accordance with some embodiments. In alternative embodiments, the ion implantation process 170 is performed before the ion implantation process 160. The respective step is illustrated as the step S19 in the method 10 shown in FIG. 4.

Some processes used to form the patterned mask 119 in FIG. 23 are similar to, or the same as, those used to form the patterned mask 107 in FIG. 6, and details thereof are not repeated herein. During the ion implantation process 170, P-type dopants, such as boron (B), gallium (Ga), or indium (In), or N-type dopants, such as phosphorous (P) or arsenic (As), are introduced into the electrode layer 415 using the patterned mask 119 as an implantation mask.

It should be noted that the portion of the electrode layer 415 between the isolation structures 105a and 105b is heavily doped compared with the portion of the electrode layer 415 between the isolation structures 105b and 105c for increased conductivity, in accordance with some embodiments. In some embodiments, the dose amount of the ion implantation process 160 is greater than the dose amount of the ion implantation process 170.

After the ion implantation process 170, the patterned mask 119 may be removed. In addition, an annealing process may be used to activate the implanted dopants. In alternative embodiments, the ion implantation processes 160 and 170 shown in FIGS. 22 and 23 are replaced by the ion implantation processes 180 and 190 (see FIGS. 16 and 17).

Figure 24:
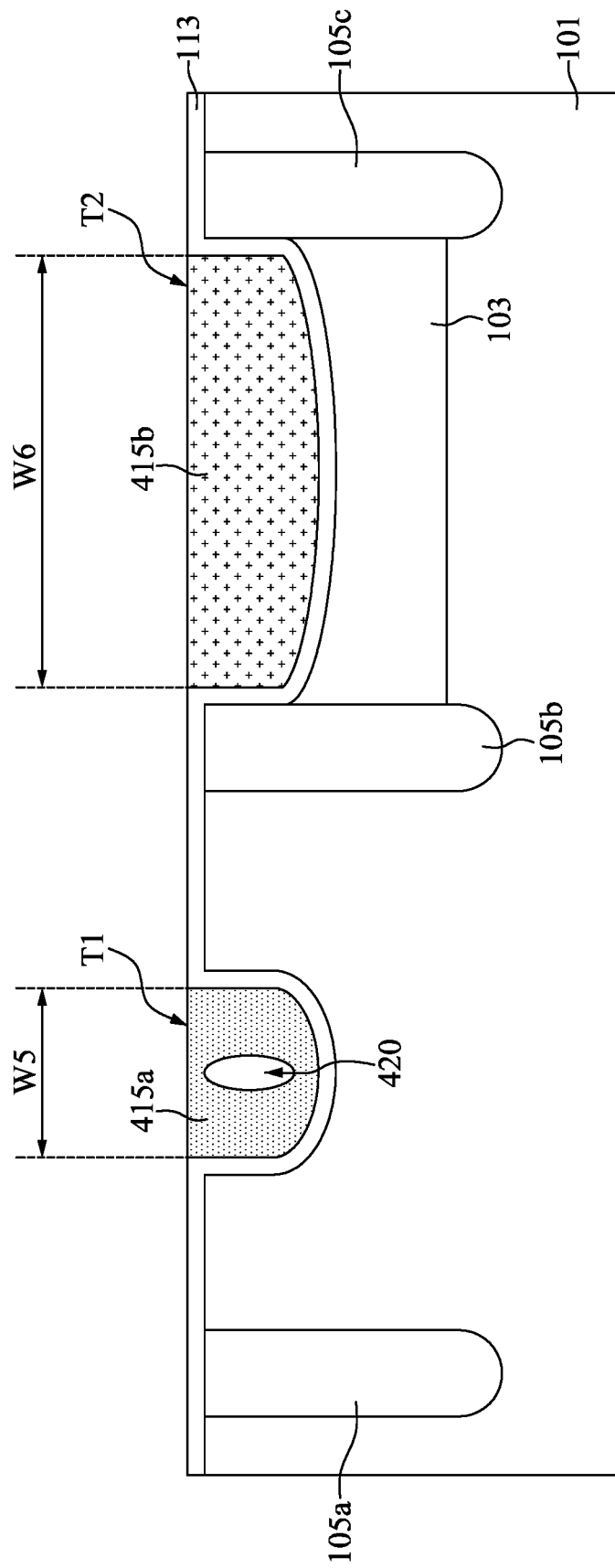
FIG. 24 is a cross-sectional view illustrating an intermediate stage of polishing the electrode layer during the formation of the semiconductor device structure, in accordance with some embodiments.

Subsequently, a polishing process is performed on the electrode layer 415 to form a fuse 415a in the opening 110a' (see FIG. 7) and a resistor electrode 415b in the opening 110b' (see FIG. 7), as shown in FIG. 24 in accordance with some embodiments. In some embodiments, the polishing process is performed until the dielectric layer 113 is exposed, and the excess portion of the electrode layer 415 over the dielectric layer 113 is removed. The respective step is illustrated as the step S21-2 in the method 10 shown in FIG. 4.

In some embodiments, the polishing process is a CMP process. In some embodiments, the isolation structure 105b is closer to the resistor electrode 415b than the fuse 415a. In some embodiments, the air gap 420 is enclosed (or sealed) in the fuse 415a. In some embodiments, the fuse 415a is an electrical fuse (e-fuse). In some embodiments, the fuse 415a has a top width W5, the resistor electrode 415b has a top width W6, and the top width W6 is greater than the top width W5.

In some embodiments, a material of the fuse 415a and a material of the resistor electrode 415b are the same, such as polysilicon. However, in some embodiments, a dopant concentration of the fuse 415a is different from a dopant concentration of the resistor electrode 415b. For example, in some embodiments, a dopant concentration of the fuse 415a is greater than a dopant concentration of the resistor electrode 415b. In some embodiments, a top surface T1 of the fuse 415a is substantially coplanar with a top surface T2 of the resistor electrode 415b.

After the fuse 415a and the resistor electrode 415b are formed, similar to the operations shown in FIGS. 12 to 15, S/D regions 121a and 121b are formed in the semiconductor substrate 101 and on opposite sides of the fuse 415a, and an ILD layer 123' and an interconnect structure 137 are formed over the dielectric layer 113', as shown in FIG. 25 in accordance with some embodiments. The respective steps are illustrated as the steps S23-2 and S25 in the method shown in FIG. 4.

In some embodiments, the interconnect structure 137 includes conductive vias 133a, 133b, 133c and 133d, and conductive layers 135a, 135b and 135c. The details (e.g., the materials and processes) of the S/D regions 121a and 121b, the ILD layer 123' and the interconnect structure 137 may be essentially the same as what are shown and discussed in FIG. 1 and FIGS. 12 to 15, and hence are not repeated herein. After the interconnect structure 137 is formed, the semiconductor device structure 400a is obtained.

In some embodiments, the semiconductor device structure 400a includes the fuse 415a and a resistor 200. As mentioned above, the top surface T1 of the fuse 415a is substantially coplanar with the top surface T2 of the resistor electrode 415b of the resistor 200, in accordance with some embodiments. Moreover, the isolation structure 105b between the fuse 415a and the resistor electrode 415b has a top surface T3 covered by and in direct contact with the dielectric layer 113'.

In some embodiments, the second sidewall SW2 of the isolation structure 105b is in direct contact with the dielectric layer 113'. In some embodiments, the dielectric layer 113' has a first portion 113'a extending between the fuse 415a and the semiconductor substrate 101, and a second portion 113'b extends between the resistor electrode 415b and the well region 103. In addition, the S/D region 121b is electrically connected to the resistor electrode 415b of the resistor 200 through the conductive via 133b, the conductive layer 135b and the conductive via 133c of the interconnect structure 137, in accordance with some embodiments.

Figure 26:
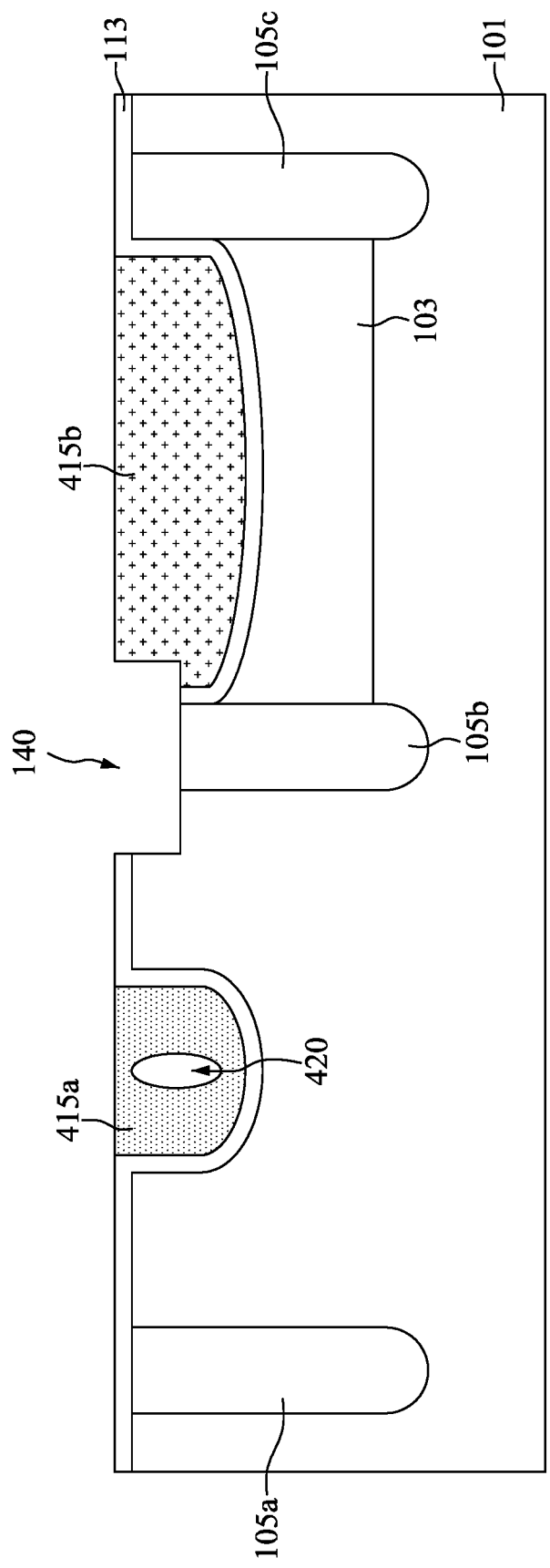
FIG. 26 is a cross-sectional view illustrating an intermediate stage of forming an opening in the semiconductor substrate during the formation of the semiconductor device structure, in accordance with some embodiments.
Figure 27:
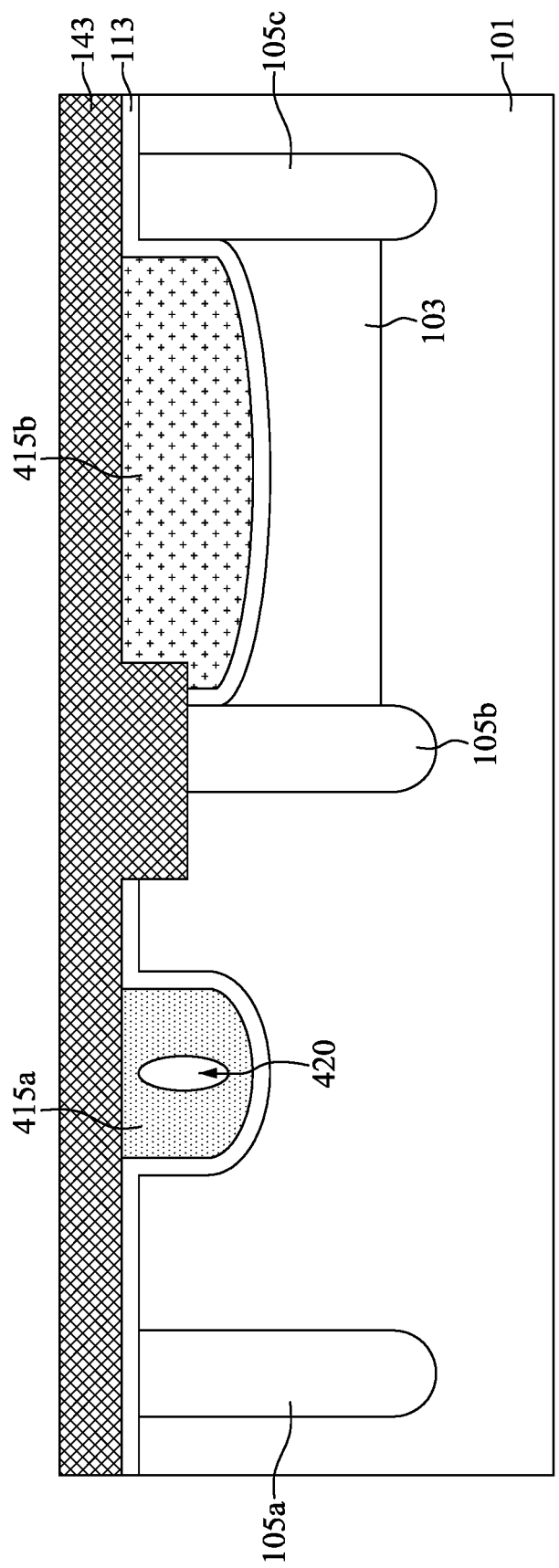
FIG. 27 is a cross-sectional view illustrating an intermediate stage of forming a conductive layer during the formation of the semiconductor device structure, in accordance with some embodiments.
Figure 28:
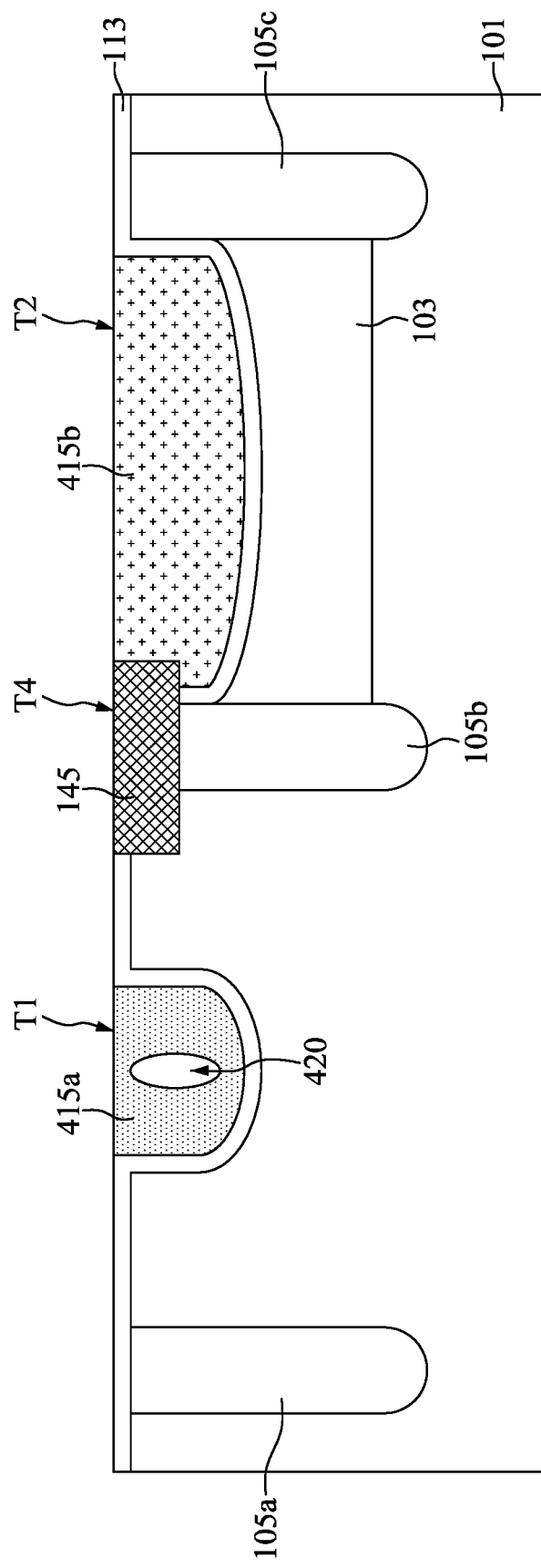
FIG. 28 is a cross-sectional view illustrating an intermediate stage of forming a conductive structure during the formation of the semiconductor device structure, in accordance with some embodiments.

FIGS. 26 to 28 are cross-sectional views illustrating intermediate stages in the formation of a semiconductor device structure 400b shown in FIG. 29, in accordance with some embodiments. It should be pointed out that operations for forming the semiconductor device structure 400b before the structure shown in FIG. 26 are substantially the same as the operations for forming the semiconductor device structure 300a shown in FIGS. 5-7 and the subsequent operations for forming the semiconductor device structure 400a shown in FIGS. 21-24. (The respective steps are illustrated as the steps S11 to S21-2 in the method 10 shown in FIG. 4), and the related detailed descriptions may refer to the foregoing paragraphs and are not discussed again herein.

After the electrode layer 415 is polished to form the fuse 415a and the resistor electrode 415b (see FIG. 24), similar to the operation shown in FIG. 18, an upper portion of the isolation structure 105b is etched to form an opening 140, in accordance with some embodiments.

The opening 140 may be formed by using a patterned mask (not shown) as an etching mask. In some embodiments, the dielectric layer 113, the semiconductor substrate 101, the resistor electrode 415b are partially etched to form the opening 140.

Next, similar to the operation shown in FIG. 19, a conductive layer 143 is formed over the dielectric layer 113, and the opening 140 is filled by the conductive layer 143, as shown in FIG. 27 in accordance with some embodiments. In some embodiments, the conductive layer 143 is in direct contact with the resistor electrode 415b. The details (e.g., the materials and processes) of the conductive layer 143 may be essentially the same as what are shown and discussed in FIG. 19, and hence are not repeated herein.

After the conductive layer 143 is formed, similar to the operation shown in FIG. 20, a planarization process is performed to expose the fuse 415a and the resistor electrode 415b, and a conductive structure 145 is formed in the semiconductor substrate 101 and over the isolation structure 105b, as shown in FIG. 28 in accordance with some embodiments. The planarization process for forming the conductive structure 145 may include a CMP process, a grinding process, an etching process, another suitable process, or a combination thereof. After the planarization process, the top surface T1 of the fuse 415a, the top surface T2 of the resistor electrode 415b and the top surface T4 of the conductive structure 145 are substantially coplanar with each other, in accordance with some embodiments.

Subsequently, the processes of FIGS. 12 to 15 used to form the semiconductor device structure 300a are performed on the structure of FIG. 28, such that the semiconductor device structure 400b is obtained, as shown in FIG. 29 in accordance with some embodiments. In some embodiments, the semiconductor device structure 400b includes the fuse 415a and a resistor 200. Since the connecting fashion of the fuse 415a and the resistor 200 are different between the semiconductor device structures 400a and 400b, the openings 130b and 130c (see FIG. 15) are not formed in the ILD layer 123', such that the interconnect structure 137 of the semiconductor device structure 400b (see FIG. 29) only includes the conductive vias 133a, 133d, and the conductive layers 135a, 135c. However, in some other embodiments, the interconnect structure 137 of the semiconductor device structure 400b includes other conductive elements for electrically connecting with other devices.

In some embodiments, the top surface T1 of the fuse 415a, the top surface T2 of the resistor electrode 415b of the resistor 200, and the top surface T4 of the conductive structure 145 are substantially coplanar with each other. In some embodiments, the second sidewall SW2 of the isolation structure 105b is in direct contact with the dielectric layer 113'. In some embodiments, the dielectric layer 113' has a first portion 113'a extending between the fuse 415a and the semiconductor substrate 101, and a second portion 113'b extends between the resistor electrode 415b and the well region 103. In addition, the S/D region 121b is electrically connected to the resistor electrode 415b of the resistor 200 through the conductive structure 145, in accordance with some embodiments.

Embodiments of the semiconductor device structures 300a and 300b are provided in the disclosure. The semiconductor device structures 300a and 300b include the transistor 100 (e.g., the PMOS transistor 100P or the NMOS transistor 100N) and the resistor 200 connected in series and formed by an integrated process flow.

Particularly, the gate electrode 115a of the transistor 100 and the resistor electrode 115b of the resistor 200 are formed in the semiconductor substrate 101 by the same process steps. Therefore, the resistor 200 may have high sheet resistance without using additional masks or process steps. As a result, the associated costs may be reduced, and the performance of the semiconductor device structures 300a and 300b may be improved.

Moreover, embodiments of the semiconductor device structures 400a and 400b are provided in the disclosure. The semiconductor device structures 400a and 400b include the fuse 415a and the resistor 200 connected in series and formed by an integrated process flow. Since the fuse 415a and the resistor electrode 415b of the resistor 200 are formed in the semiconductor substrate 101 by the same process steps, the associated costs may be reduced, and the performance of the semiconductor device structures 400a and 400b may be improved.

In one embodiment of the present disclosure, a semiconductor device structure is provided. The semiconductor device structure includes an isolation structure disposed in a semiconductor substrate. The semiconductor device structure also includes a fuse and a resistor electrode disposed in the semiconductor substrate. The isolation structure is disposed between the fuse and the resistor electrode, and the isolation structure is closer to the resistor electrode than the fuse.

The semiconductor device structure further includes a source/drain (S/D) region disposed in the semiconductor substrate and between the fuse and the isolation structure. The S/D region is electrically connected to the resistor electrode.

In another embodiment of the present disclosure, a semiconductor device structure is provided. The semiconductor device structure includes a fuse and a resistor electrode disposed in a semiconductor substrate. A dopant concentration of the fuse is greater than a dopant concentration of the resistor electrode. The semiconductor device structure also includes an isolation structure disposed in the semiconductor substrate and between the fuse and the resistor electrode. The semiconductor device structure further includes a source/drain (S/D) region disposed in the semiconductor substrate and between the fuse and the isolation structure. The S/D region is electrically connected to the resistor electrode.

In yet another embodiment of the present disclosure, a method for preparing a semiconductor device structure is provided. The method includes forming an isolation structure in a semiconductor substrate, and recessing the semiconductor substrate to form a first opening and a second opening. The first opening and the second opening are on opposite sides of the isolation structure, and a width of the second opening is greater than a width of the first opening. The method also includes forming an electrode layer over the semiconductor substrate, and polishing the electrode layer to form a fuse in the first opening and a resistor electrode in the second opening. The method further includes forming a source/drain (S/D) region in the semiconductor substrate. The S/D region is between the fuse and the isolation structure.

The embodiments of the present disclosure have some advantageous features. By forming a gate electrode of a transistor and a resistor electrode of a resistor in a semiconductor substrate by the same process steps, the resistor may have high sheet resistance without using additional masks or process steps. This significantly reduces the associated costs, and the performance of the semiconductor device structure including the transistor and the resistor may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
   forming an isolation structure in a semiconductor substrate;
   recessing the semiconductor substrate to form a first opening and a second opening, wherein the first opening and the second opening are on opposite sides of the isolation structure, and a width of the second opening is greater than a width of the first opening;
   forming an electrode layer over the semiconductor substrate;
   polishing the electrode layer to form a fuse in the first opening and a resistor electrode in the second opening; and
   forming a source/drain (S/D) region in the semiconductor substrate, wherein the S/D region is between the fuse and the isolation structure.

2. The method for preparing a semiconductor device structure of claim 1, wherein an air gap is enclosed in the fuse.

3. The method for preparing a semiconductor device structure of claim 1, further comprising:
   forming a well region in the semiconductor substrate before the first opening and the second opening are formed, wherein the second opening is formed by removing an upper portion of the well region.

4. The method for preparing a semiconductor device structure of claim 3, wherein a bottom surface of the well region is higher than a bottom surface of the isolation structure.

5. The method for preparing a semiconductor device structure of claim 1, wherein the isolation structure is closer to the second opening than the first opening.

6. The method for preparing a semiconductor device structure of claim 5, wherein a sidewall of the isolation structure is exposed by the second opening before the electrode layer is formed.

7. The method for preparing a semiconductor device structure of claim 1, further comprising:
   depositing a dielectric layer over the semiconductor substrate before the electrode layer is formed, wherein the dielectric layer extends into the first opening and the second opening.

8. The method for preparing a semiconductor device structure of claim 7, wherein the dielectric layer is in direct contact with a sidewall of the isolation structure.

9. The method for preparing a semiconductor device structure of claim 1, further comprising:
   performing an ion implantation process on the electrode layer before the electrode layer is polished.

10. The method for preparing a semiconductor device structure of claim 1, wherein a top surface of the fuse is substantially coplanar with a top surface of the resistor electrode after the electrode layer is polished.

11. The method for preparing a semiconductor device structure of claim 1, further comprising:
    forming an interlayer-dielectric (ILD) layer over the semiconductor substrate; and
    forming an interconnect structure in the ILD layer, wherein the S/D region is electrically connected to the resistor electrode through the interconnect structure.

12. The method for preparing a semiconductor device structure of claim 11, wherein the forming the interconnect structure comprises:
    etching the ILD layer to form a third opening exposing the S/D region and a fourth opening exposing the resistor electrode;
    forming a first conductive via in the third opening and a second conductive via in the fourth opening; and
    forming a conductive layer over the ILD layer and electrically connecting the first conductive via and the second conductive via.

13. The method for preparing a semiconductor device structure of claim 1, further comprising:
    etching an upper portion of the isolation structure to form a fifth opening after the electrode layer is polished; and
    forming a conductive structure in the fifth opening before the S/D region is formed, wherein the conductive structure is used to electrically connect the resistor electrode and the S/D region.

* * * * *